United States Patent
Sugiura et al.

(10) Patent No.: US 12,414,358 B2
(45) Date of Patent: Sep. 9, 2025

(54) SEMICONDUCTOR DEVICE

(71) Applicant: DENSO CORPORATION, Kariya (JP)

(72) Inventors: Hiroto Sugiura, Kariya (JP); Masakiyo Sumitomo, Kariya (JP)

(73) Assignee: DENSO CORPORATION, Kariya (JP)

( * ) Notice: Subject to any disclaimer, the term of this patent is extended or adjusted under 35 U.S.C. 154(b) by 531 days.

(21) Appl. No.: 17/862,483

(22) Filed: Jul. 12, 2022

(65) Prior Publication Data
US 2023/0027536 A1 Jan. 26, 2023

(30) Foreign Application Priority Data
Jul. 14, 2021 (JP) .................. 2021-116409

(51) Int. Cl.
- *H10D 84/60* (2025.01)
- *H10D 8/00* (2025.01)
- *H10D 12/00* (2025.01)
- *H10D 62/17* (2025.01)

(52) U.S. Cl.
CPC ........... *H10D 84/617* (2025.01); *H10D 8/422* (2025.01); *H10D 12/481* (2025.01); *H10D 62/393* (2025.01)

(58) Field of Classification Search
CPC ... H01L 27/0623; H01L 27/0617–0635; H01L 27/0705–0738; H01L 27/088–0883; H01L 29/66325–66348; H01L 29/7393–7398; H01L 2924/13055; H01L 29/83; H01L 29/083–0839; H01L 29/6634; H01L 29/7428; H10D 84/617; H10D 12/481; H10D 8/422; H10D 62/393
See application file for complete search history.

(56) References Cited

U.S. PATENT DOCUMENTS

| | | | |
|---|---|---|---|
| 2009/0057832 A1 | 3/2009 | Kouno | |
| 2012/0025264 A1 | 2/2012 | Kouno | |
| 2013/0334567 A1 | 12/2013 | Kouno | |
| 2015/0123718 A1 | 5/2015 | Kouno | |
| 2015/0263144 A1* | 9/2015 | Misu | .............. H01L 29/7397 257/139 |
| 2019/0096989 A1* | 3/2019 | Yoshida | .............. H01L 27/0761 |
| 2019/0165102 A1* | 5/2019 | Fujimoto | .......... H01L 29/66068 |
| 2019/0206860 A1* | 7/2019 | Kamimura | ........ H01L 29/66348 |

(Continued)

FOREIGN PATENT DOCUMENTS

JP 2019-021885 A 2/2019

*Primary Examiner* — Jeff W Natalini
*Assistant Examiner* — Andrew Zabel
(74) *Attorney, Agent, or Firm* — Posz Law Group, PLC

(57) ABSTRACT

A semiconductor device includes a main element and a sense element. Each of the main element and the sense element includes a drift layer, a base layer, an emitter region, a gate insulation film, a gate electrode, and a rear surface layer. The base layer is on the drift layer. The emitter region is at a surface layer portion of the base layer. The gate insulation film is disposed at a surface of the base layer between the emitter region and the drift layer. The gate electrode is on the gate insulation film. The rear surface layer faces the base layer with the drift layer between the rear surface layer and the base layer. The rear surface layer in the main element includes a collector layer. The rear surface layer in the sense element includes a low-impurity layer having smaller amount of impurities than the collector layer.

5 Claims, 18 Drawing Sheets

(56) References Cited

U.S. PATENT DOCUMENTS

| | | | |
|---|---|---|---|
| 2019/0252374 A1* | 8/2019 | Kanetake | H01L 29/0615 |
| 2019/0252534 A1* | 8/2019 | Murakawa | H01L 29/0834 |
| 2019/0296149 A1 | 9/2019 | Yamamoto et al. | |
| 2020/0035817 A1* | 1/2020 | Tamura | H01L 29/0696 |
| 2020/0058803 A1* | 2/2020 | Naito | H01L 29/78 |
| 2020/0098747 A1* | 3/2020 | Tamura | H01L 29/7397 |
| 2020/0105745 A1* | 4/2020 | Obata | H01L 27/0664 |
| 2020/0194429 A1* | 6/2020 | Naito | H01L 29/12 |
| 2020/0194562 A1* | 6/2020 | Yoshimura | H01L 21/22 |
| 2020/0395215 A1* | 12/2020 | Kubouchi | H01L 29/7397 |
| 2022/0069086 A1 | 3/2022 | Tsunoda | |
| 2023/0268429 A1 | 8/2023 | Kudo | |

\* cited by examiner

SEMICONDUCTOR DEVICE

CROSS REFERENCE TO RELATED APPLICATIONS

This application is based on Japanese Patent Application No. 2021-116409 filed on Jul. 14, 2021, the disclosure of which is incorporated herein by reference.

TECHNICAL FIELD

The present disclosure relates to a semiconductor device.

BACKGROUND

A semiconductor device may include a main region and a sense region. A main element is formed at the main region, and a sense element is formed at the sense region.

SUMMARY

The present disclosure describes a semiconductor device including a main element and a sense element, and further describes that each of the main element and the sense element has a rear surface layer.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
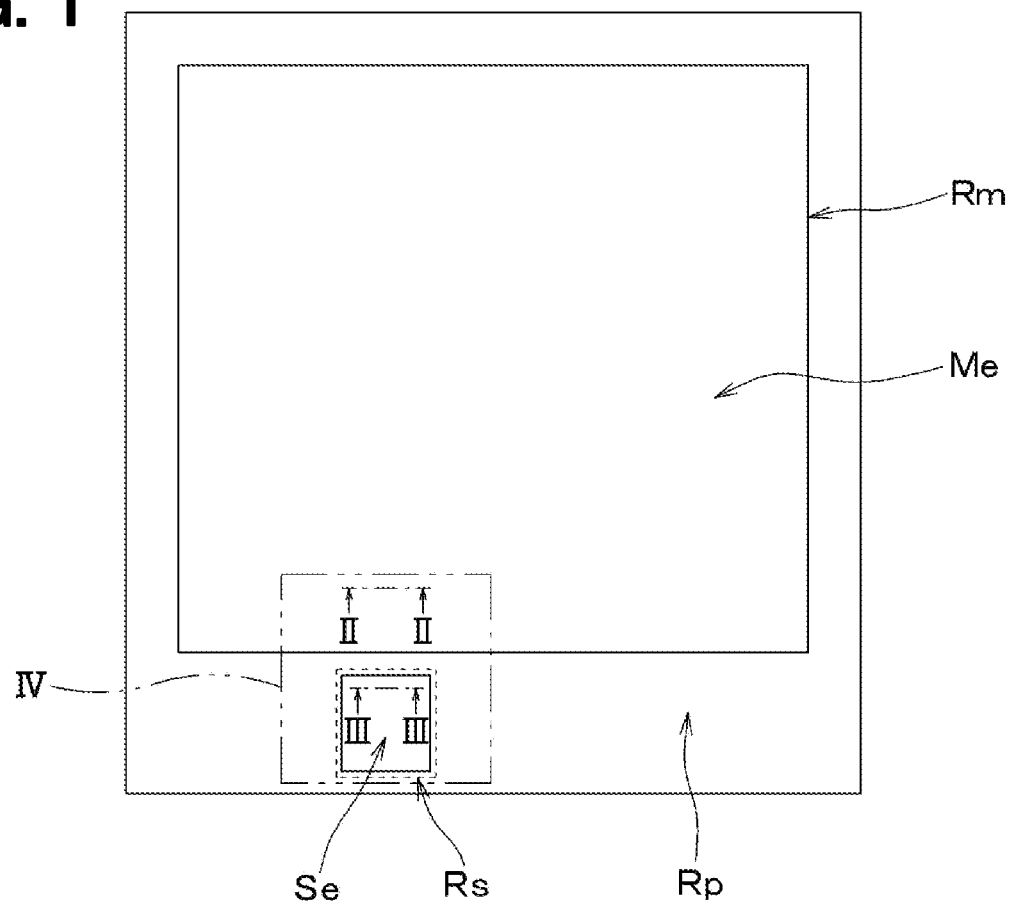
FIG. 1 is a plan view of a semiconductor device according to a first embodiment.

In a semiconductor device, a common insulated gate bipolar transistor (IGBT) is formed as a main element and a sense element. The main element and the sense element, in other words, the main region and the sense region may be formed to have a predetermined area ratio.

In such a semiconductor device, a detection resistor may be connected to the sense element in series, and a main current flowing through the main element may be formed as a detected signal for detecting a voltage between both ends of the detection resistor. In other words, the sense current flowing through the sense element is derived based on the detected signal. The current flowing through the main element and the current flowing through the sense element depend on the ratio of the area of the main element to the area of the sense element. Therefore, the main current flowing through the main element is derived from the sense current flowing through the sense element and the ratio of the area of the main element to the area of the sense element.

Such a semiconductor device described above may also determine whether the semiconductor device is in a steady state (in other words, a normal state or a stationary state) or a fault state based on the detected signal. Thus, in such a semiconductor device described above, it is possible to inhibit an erroneous determination by enlarging a differential voltage acquired based on the difference between the level of a steady detected signal at the steady state and the level of a fault detected signal at the fault state.

For example, a saturation current is enlarged to enlarge the level of the fault detected signal for enlarging the differential voltage, and impurity concentration in the IGBT element is increased for enlarging the differential voltage. However, in such a structure, switching loss caused by switching off the semiconductor device may increase.

According to an aspect of the present disclosure, a semiconductor device includes a main element disposed at a main region and a sense element disposed at a sense region. The main element allows a main current to flow through the main element, and the sense element allows a sense current to flow through the sense element. The main current flowing through the main element is detected based on the sense current flowing through the sense element. Each of the element and the sense element includes a drift layer of a first conductivity type, a base layer of a second conductivity type, an emitter region of the first conductivity type, a gate insulation film, a gate electrode, a rear surface layer, a first electrode and a second electrode. The base layer is disposed on the drift layer. The emitter region is disposed at a surface layer portion of the base layer, and has higher impurity concentration than the drift layer. The gate insulation film is disposed at a surface of the base layer interposed between the emitter region and the drift layer. The gate electrode is disposed on the gate insulation film. The rear surface layer is disposed at a side facing the base layer with the drift layer interposed between the rear surface layer and the base layer. The first electrode is electrically connected to the emitter region and the base layer. The second electrode is electrically connected to the rear surface layer. The rear surface layer in the main element includes a collector layer of the second conductivity type. The rear surface layer in the sense element includes a low-impurity layer of the second conductivity type having lower amount of impurities than the collector layer along a stacking direction of the drift layer and the base layer.

The sense element includes a low-impurity layer, and the injection of the carriers, for example, holes from the rear surface layer is suppressed. Therefore, it is possible to reduce the level of the sense current flowing through the sense element in the steady state, and is possible to reduce the level of the steady detected signal. It is possible to sufficiently enlarge the differential voltage acquired based on the difference between the level of the steady detected signal and the level of the fault detected signal. In this semiconductor device, it is possible to suppress an increase in the switching loss caused by switching off the semiconductor device, since it is not required to increase the impurity concentration of the collector layer to be larger than a necessary level.

Hereinafter, embodiments of the present disclosure will be described with reference to the drawings. In the following embodiments, the same reference numerals are assigned to parts that are the same or equivalent to each other to describe the same.

First Embodiment

A first embodiment will be described with reference to the drawings. A semiconductor device according to the present embodiment may be adapted to, for example, an electric automobile in which a large current flows.

The semiconductor device according to the present embodiment has a main region Rm where a main element Me is formed, a sense region Rs where a sense element Se is formed and a peripheral region Rp, as illustrated in FIG. 1. The following describes the configuration of each of the main region Rm and the sense region Rs with reference to FIGS. 1 to 4.

The main element Me and the sense element Se according to the present embodiment have identical configurations except the part at a side closer to a second surface 10*b* of a semiconductor substrate 10. The second surface 10*b* of the semiconductor substrate 10 is located at a side facing a first surface 10*a* of the semiconductor substrate 10 described hereinafter. The second surface 10*b* may also be referred to as a rear surface. The main element Me and the sense element Se are formed so as to have a predetermined area ratio. For example, the ratio of the area of the main element Me to the area of the sense element Se is 3000:1. In the semiconductor device according to the present embodiment, a main current flowing through the main element Me is detected according to a sense current flowing through the sense element Se and the area ratio. In other words, the main current is derived according to the sense current and the area ratio.

The semiconductor device includes the semiconductor substrate 10. The semiconductor substrate 10 has an N$^-$-type drift layer 11, and a P-type base layer 12 having a relatively low impurity concentration and arranged on the drift layer 11. In the following, the surface of the semiconductor substrate 10 at a side closer to the base layer 12 is referred to as the first surface 10*a* of the semiconductor substrate 10, and the surface of the semiconductor substrate 10 at a side closer to the drift layer 11 is referred to as the second surface 10*b* of the semiconductor substrate 10. The first surface 10*a* may also be referred to as a front surface.

In addition, multiple trenches 13 are formed in the semiconductor substrate 10 so as to penetrate the base layer 12 from the first surface 10*a* and reach the drift layer 11, and the base layer 12 is separated into multiple portions by the trenches 13. The lengthwise direction of each of the trenches 13 is one direction in a plane direction of the first surface 10*a* of the semiconductor substrate 10, in other words, a direction going away from the plane of the drawing of FIG. 2, and the trenches 13 are formed at regular intervals in a stripe manner.

The trenches 13 are configured so that portions formed in the main region Rm and portions formed in the sense region Rs are connected to each other. The trenches 13 extend from the main region Rm to the sense region Rs through the peripheral region Rp. However, the trenches 13 are formed so that portions formed in the main region Rm and portions formed in the sense region Rs are separated.

Each of the trenches 13 is filled with a gate insulation film 14 and a gate electrode 15. The gate insulation film 14 is formed so as to cover a wall surface of each of the trenches 13, and the gate electrode 15 made of polysilicon or the like is formed on the gate insulation film 14. Accordingly, a trench gate structure is formed. In the following, the trenches 13 may also be described in a singular form, that is, a trench 13. In the present embodiment, a portion of the wall surface of the trench 13 for exposing the base layer 12 corresponds to a surface of the base layer 12 arranged between an Ni-type emitter region 16 described hereinafter and the drift layer 11.

The emitter region 16 and a Pt-type contact region 17 sandwiched by the emitter region 16 are formed at a surface layer portion of the base layer 12. The emitter region 16 has higher impurity concentration than the drift layer 11, and is in contact with the side surface of the trench 13. The contact region 17 has higher impurity concentration than the base layer 12, and is formed at a side facing the trench 13 with the emitter region 16 interposed between the contact region 17 and the trench 13.

The emitter region 16 extends in a rod-like shape to be in contact with the side surface of the trench 13 along the lengthwise direction of the trench 13 in a region between the trenches 13. The contact region 17 is interposed between the two emitter regions 16, and extends in a rod-like shape along the lengthwise direction of the trench 13. In other words, the contact region 17 extends along the emitter region 16. The contact region 17 according to the present embodiment are formed deeper than the emitter region 16 with reference to the first surface 10a of the semiconductor substrate 10.

In the present embodiment, the emitter region 16 is formed at the main region Rm and the sense region Rs, and is not formed at the peripheral region Rp. In the present embodiment, at a side closer to the first surface 10a of the semiconductor substrate 10, the portion where the emitter region 16 is formed is set as the main region Rm or the sense region Rs; and the portion where the emitter region 16 is not formed is set as the peripheral region Rp. In other words, at the side closer to the first surface 10a of the semiconductor substrate 10, the main region Rm, the sense region Rs and the peripheral region Rp are defined depending on whether or not the emitter region 16 is formed.

The planar region of the sense region Rs at the side closer to the second surface 10b of the semiconductor substrate 10 is larger than the planar region of the sense region Rs at the side closer to the first surface 10a. In particular, at the side closer to the second surface 10b of the semiconductor substrate 10, a region that is totally larger than the sense region Rs at the side closer to the first surface 10a by only the thickness of the semiconductor substrate 10 is set as the sense region Rs. In FIG. 1, a region of the sense region Rs at a side closer to the second surface 10b is illustrated by a dotted line; and a region of the sense region Rs at a side closer to the first surface 10a is illustrated by a solid line.

On the base layer 12, in other words, the first surface 10a of the semiconductor substrate 10, an interlayer insulation film 18 made of borophosphosilicate glass (BPSG) or the like is formed. A contact hole 18a is formed at the interlayer insulation film 18. The contact hole 18a is formed to expose a portion of the emitter region 16 and the contact region 17.

An upper electrode 19 is formed on the interlayer insulation film 18. The upper electrode 19 is electrically connected to the emitter region 16 and the contact region 17 through the contact hole 18a. In the present embodiment, the upper electrode 19 corresponds to a first electrode.

An N-type field stop layer (hereinafter, simply referred to as an FS layer) 20 is formed at a side the drift layer 11 facing the base layer 12. In other words, the FS layer 20 is formed at the side closer to the second surface 10b of the semiconductor substrate 10. The FS layer 20 is not necessarily needed, but is provided in order to improve characteristics of breakdown voltage and steady loss by preventing spread of a depletion layer, and control implantation amount of holes injected from the side of the second surface 10b of the semiconductor substrate 10.

Figure 2:
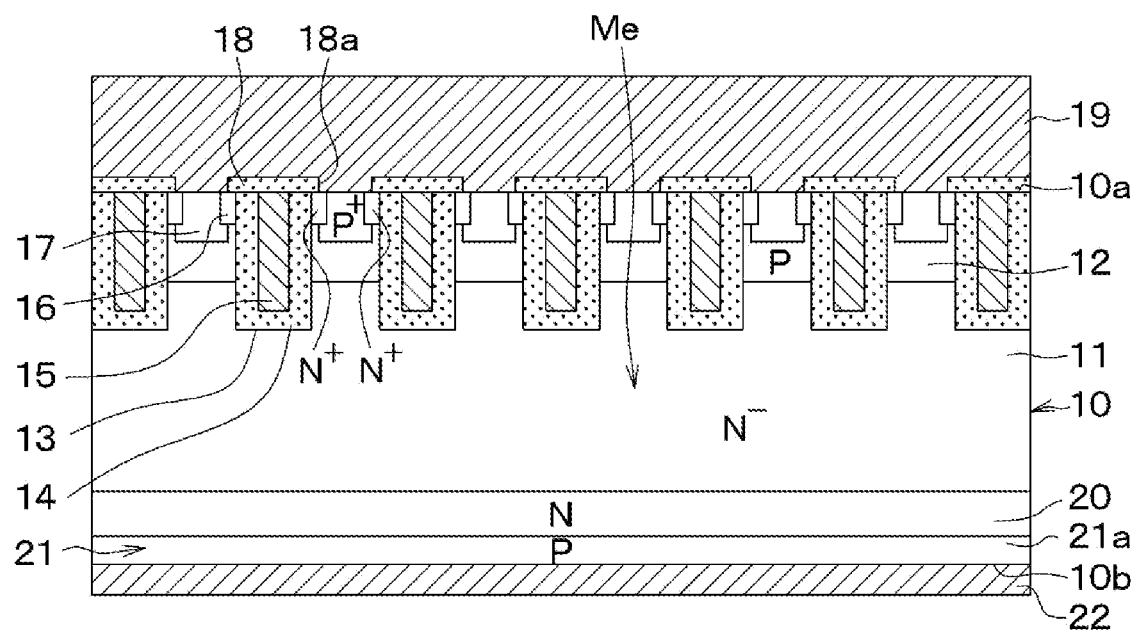
FIG. 2 is a cross-sectional view of the semiconductor device taken along a line II-II shown in FIG. 1.
Figure 3:
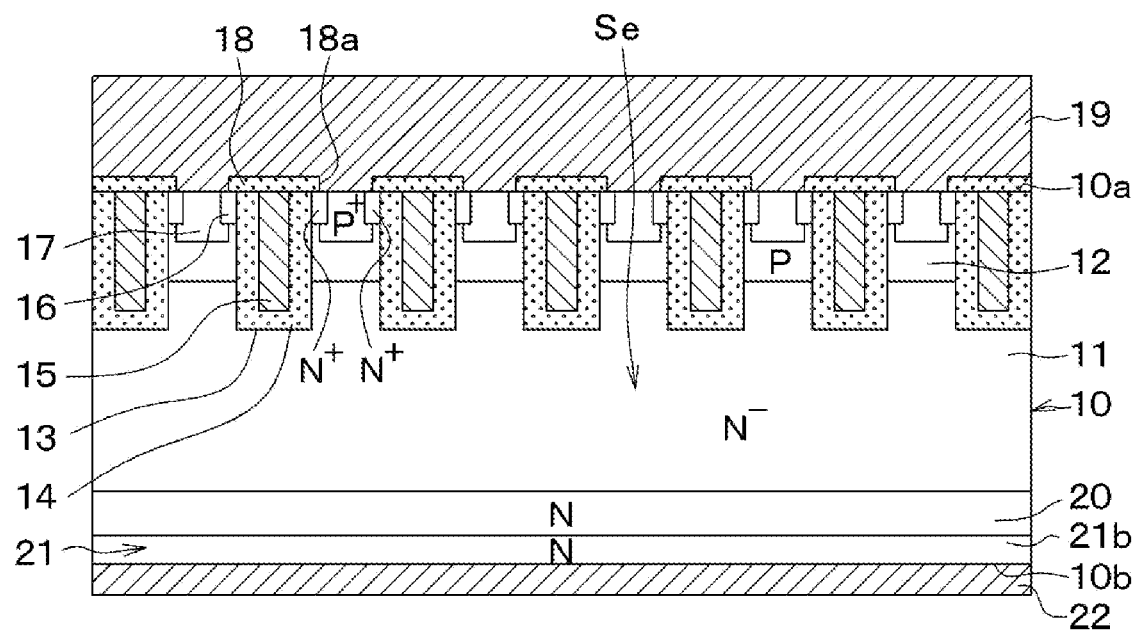
FIG. 3 is a cross-sectional view of the semiconductor device taken along a line III-III shown in FIG. 1.
Figure 4:
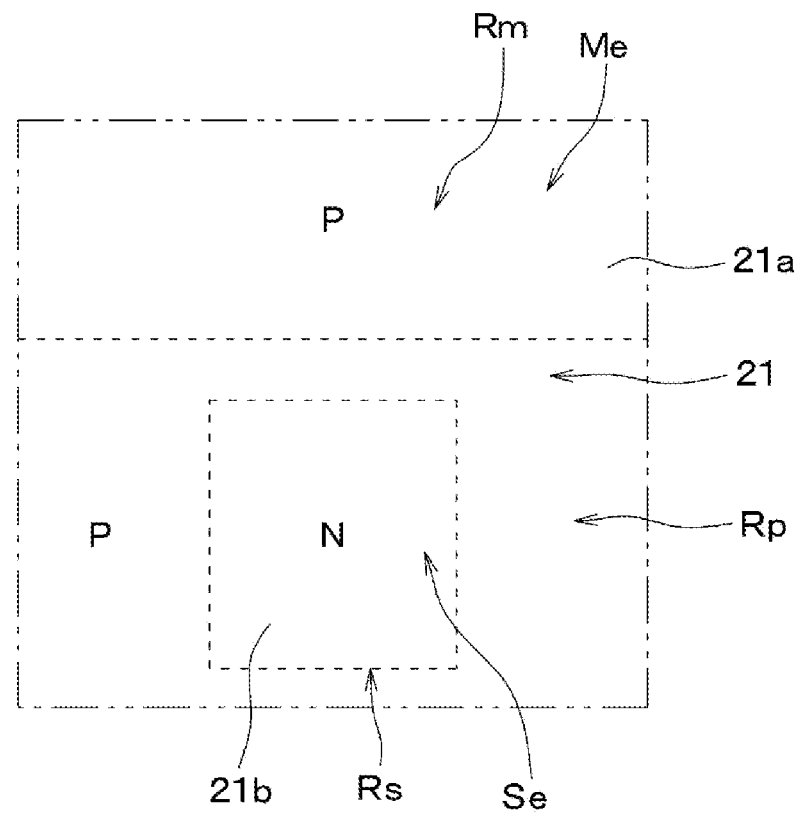
FIG. 4 is a plan view of a second surface of a semiconductor substrate in a region IV of FIG. 1.

A rear surface layer 21 is formed at a side facing the drift layer 11 with the FS layer 20 interposed between the drift layer 11 and the rear surface layer 21. With regard to the main region Rm, as illustrated in FIGS. 2, 4, a P-type collector layer 21a is formed as the rear surface layer 21. On the other hand, with regard to the sense region Rs, as illustrated in FIGS. 3, 4, an N-type reverse conductivity-type layer 21b whose conductivity type is opposed to the collector layer 21a is formed as the rear surface layer 21. That is, in the sense region Rs, the reverse conductivity-type layer 21b having a smaller amount of P-type impurities than the collector layer 21a is formed along the thickness direction of the semiconductor substrate 10. In the sense region Rs according to the present embodiment, the reverse conductivity-type layer 21b is entirely formed, and the collector layer 21a is not formed. In the sense region Rs according to the present embodiment, the reverse conductivity-type layer 21b is formed at the entire second surface 10b.

The collector layer 21a, which is identical to the one formed in the main region Rm, is formed at the peripheral region Rp according to the present embodiment. In the present embodiment, the reverse conductivity-type layer 21b corresponds to a low-impurity layer. A direction along the thickness direction of the semiconductor substrate 10 may also be referred to as a direction along the stacking direction of the drift layer 11 and the base layer 12.

A lower electrode 22 is formed on the collector layer 21a and the reverse conductivity-type layer 21b. In other words, the lower electrode 22 is formed at the second surface 10b of the semiconductor substrate 10. In the present embodiment, the lower electrode 22 corresponds to the second electrode.

The configuration of the semiconductor device according to the present embodiment has been described above. In the present embodiment, N⁻-type, N-type, and N⁻-type correspond to the first conductivity type, and P-type and Pt-type correspond to the second conductivity type.

The following describes the operation and advantageous effects of such a semiconductor device.

In such a semiconductor device described above, when a voltage lower than that of the lower electrode 22 is applied to the upper electrode 19 and a predetermined voltage larger than or equal to a predetermined threshold voltage is applied to the gate electrode 15, an N-type inversion layer (that is, a channel) is formed in a portion of the base layer 12 which comes in contact with the trenches 13. Electrons are provided from the emitter region 16 to the drift layer 11 through the inversion layer, and holes are provided from the collector layer 21a to the drift layer 11. Therefore, the resistance value of the drift layer 11 decreases through conductivity modulation to turn on the semiconductor device.

Figure 5:
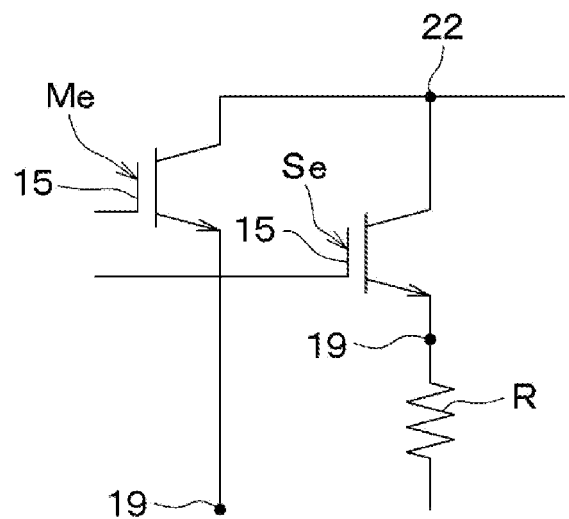
FIG. 5 is a circuit diagram in which a detection resistor is connected to a sense element.

As illustrated in FIG. 5, in such a semiconductor device, a detection resistor R is connected to the upper electrode 19 of the sense element Se, and the main current flowing through the main element Me is detected as described in the following. In the semiconductor device, since the current flowing through the detection resistor R and the sense current flowing through the sense element Se are equal, the sense current flowing through the sense element Se is detected based on a detected signal as a voltage between both ends of the detection resistor R. The main element Me and the sense element Se are formed in a predetermined area ratio. The main current flowing through the main element Me and the sense current flowing through the sense element Se are proportional to the predetermined area ratio. The main current flowing through the main region Rm is derived based on the area ratio and the sense current.

Such a semiconductor device may perform state determination to determine whether the semiconductor device is in a steady state or a fault state based on the detected signal. In this situation, an erroneous determination may be suppressed by enlarging a differential voltage acquired base on the difference between the level of a steady detected signal at the steady state (hereinafter simply referred to as the steady detected signal) and the level of a fault detected signal at the fault state (hereinafter simply referred to as the fault detected signal). In the sense element Se according to the present embodiment, the rear surface layer 21 includes the reverse conductivity-type layer 21b to enlarge the difference between the level of the steady detected signal and the level of the fault detected signal.

The steady detected signal and the fault detected signal in the present embodiment are described with comparison to a steady detected signal and a fault detected signal in a semiconductor device in a comparative example. In the semiconductor device according to the comparative example, the entire rear surface layer 21 in the sense region Rs is made to be identical to the collector layer 21a in the main region Rm. The following describes a simulation result in a case where the ratio of the area of the main region Rm to area of the sense region Rs is set to 3000:1. After the voltage larger than or equal to the predetermined threshold voltage is applied to the gate electrode 15, the detected signal between the time T1 and the time T2 is set as the steady detected signal. The time T1 is at a time where the application of the predetermined voltage to the gate electrode 15 is stopped. After the voltage larger than or equal to the predetermined threshold voltage is applied to the gate electrode 15, the detected signal between the time T3 and the time T4 is set as the fault detected signal. The time T3 is at a time where the application of the predetermined voltage to the gate electrode 15 is stopped.

Figure 6:
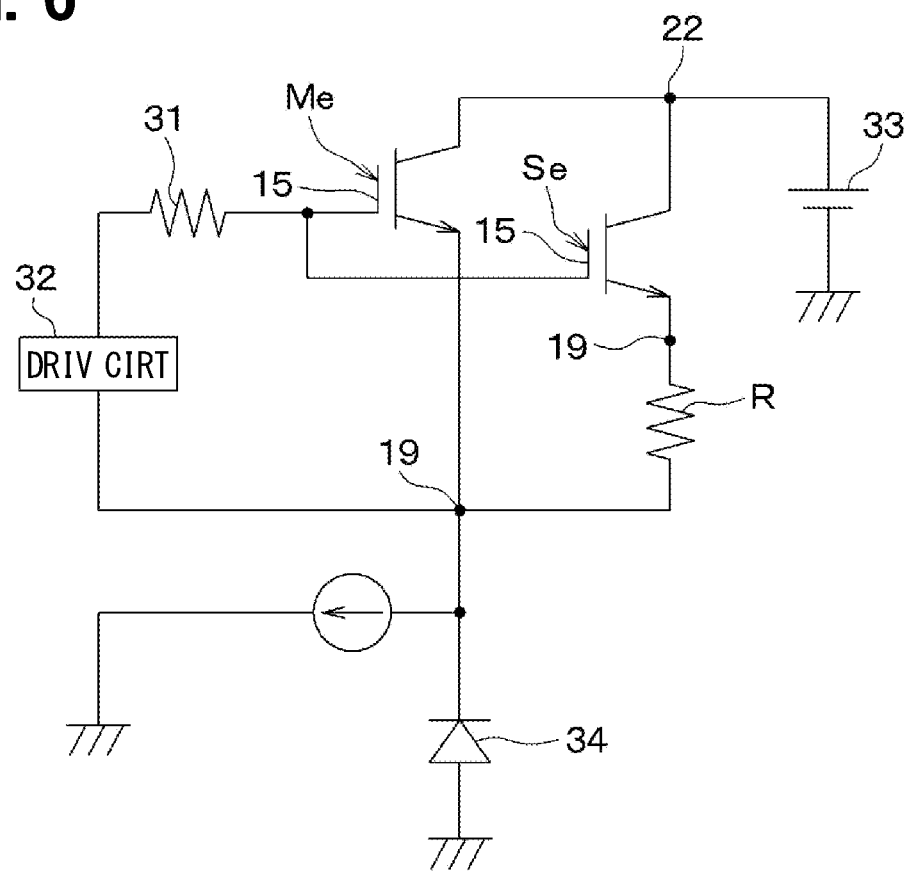
FIG. 6 is a circuit diagram illustrating a circuit is adopted for acquiring a steady detected signal.
Figure 8:
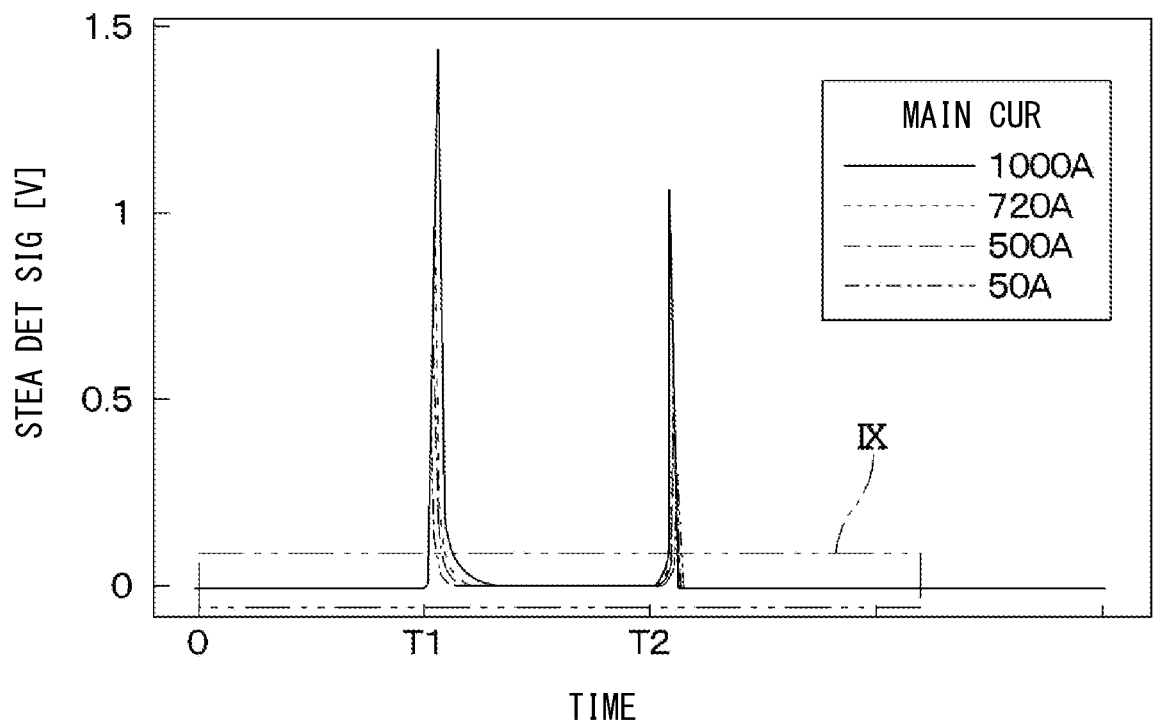
FIG. 8 illustrates a steady detected signal in the semiconductor device according to the first embodiment.
Figure 9:
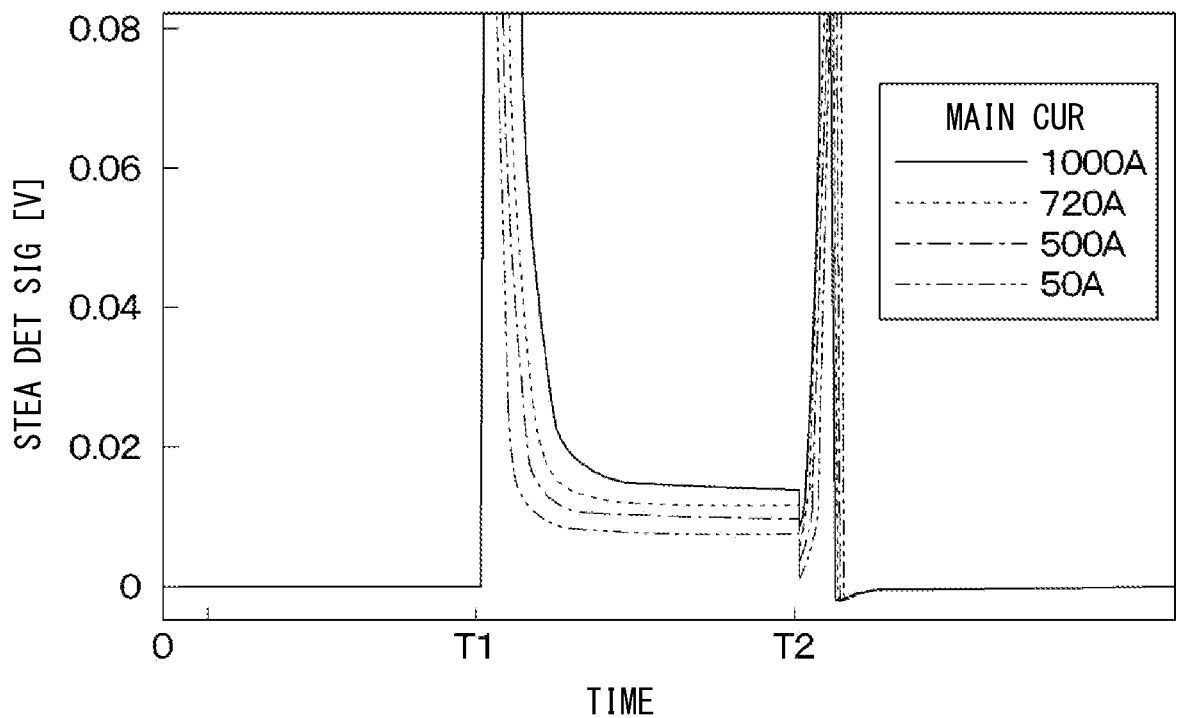
FIG. 9 is an enlarged diagram of a region IX of FIG. 8.

The simulation result of the steady detected signal acquired by a test circuit as illustrated in FIG. 6 is described with reference to FIGS. 7 to 9. In the test circuit, a drive circuit (DRIV CIRT) 32 is connected to the gate electrode 15 of each of the main element Me and the sense element Se through an adjustment resistor 31, and a positive electrode of a power supply 33 is connected to the lower electrode 22. A diode 34 is connected to the detection resistor R, and the detection resistor R is connected to the upper electrode 19 of the main element Me and the upper electrode 19 of the sense element Se.

Figure 7:
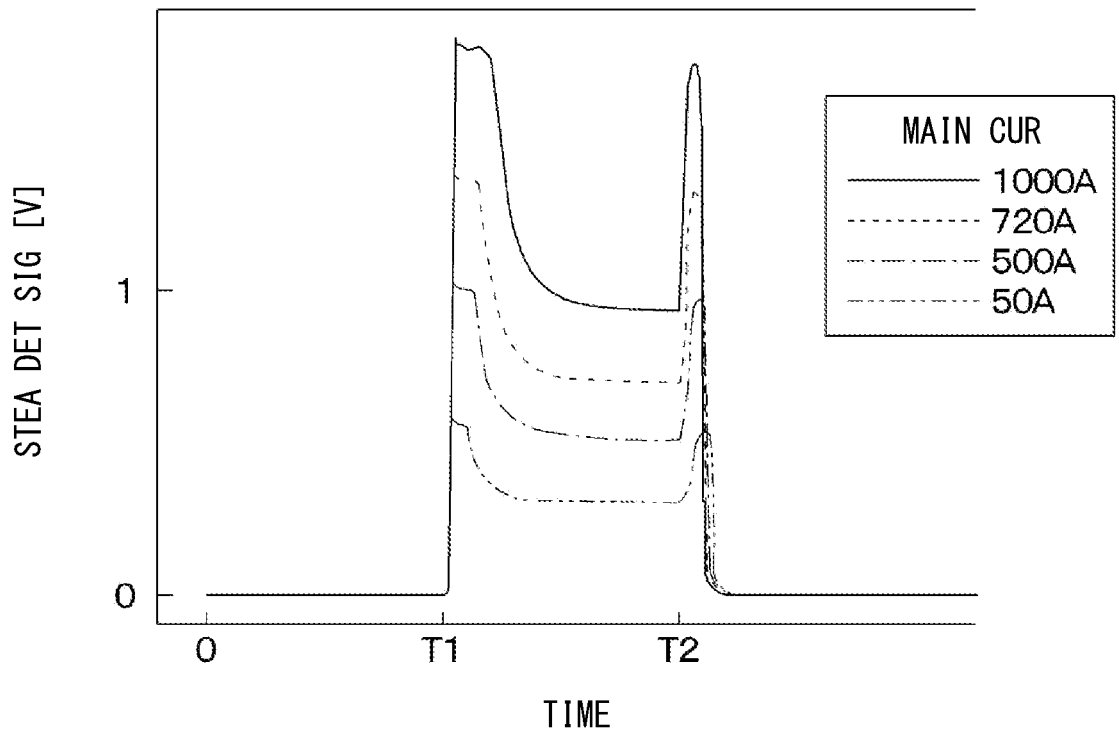
FIG. 7 illustrates a steady detected signal in a semiconductor device according to a comparative example.

As illustrated in FIG. 7, in the semiconductor device according to the comparative example, the level of the steady detected signal (STEA DET SIG) increases as the level of the main current (MAIN CUR) increases. In the semiconductor device according to the present embodiment, since the entire rear surface layer 21 in the sense region Rs is set as the reverse conductivity-type layer 21b, it is possible to suppress the supply of the holes from the second surface 10b of the semiconductor substrate 10. In the semiconductor device according to the present embodiment, as illustrated in FIGS. 8, 9, the level of the sense current decreases and the level of the steady detected signal becomes sufficiently small as compared with the semiconductor device according to the comparative example. The level of the steady detected signal in the semiconductor device according to the present embodiment slightly increases as the level of the main current increases, but does not change as much as that of the semiconductor device according to the comparative example.

Figure 10:
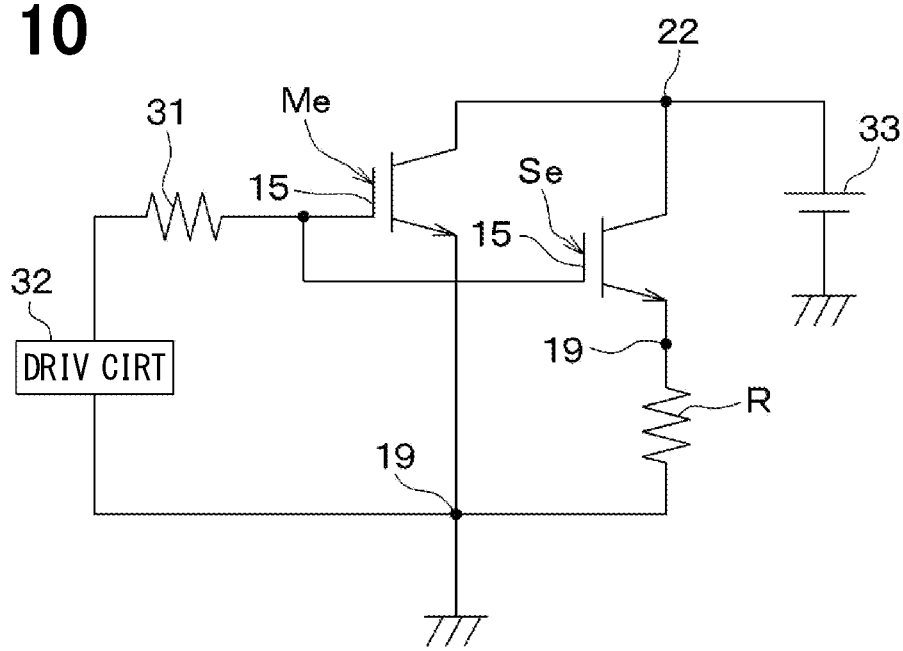
FIG. 10 is a circuit diagram illustrating a circuit is adopted for acquiring a fault detected signal.

The simulation result of the fault detected signal acquired by a test circuit as illustrated in FIG. 10 is described with reference to FIG. 11. In the test circuit, the drive circuit 32 is connected to the gate electrode 15 of each of the main element Me and the sense element Se through the adjustment resistor 31, and a positive electrode of the power supply 33 is connected to the lower electrode 22. The upper electrode 19 of the main element Me and the detection resistor R connected to the upper electrode 19 of the sense element Se are connected to ground. Each of FIGS. 11 and 12 illustrates the fault detected signal in a case where a gate-emitter voltage Vge is set to a voltage around 15 V as a typical gate drive voltage.

Figure 11:
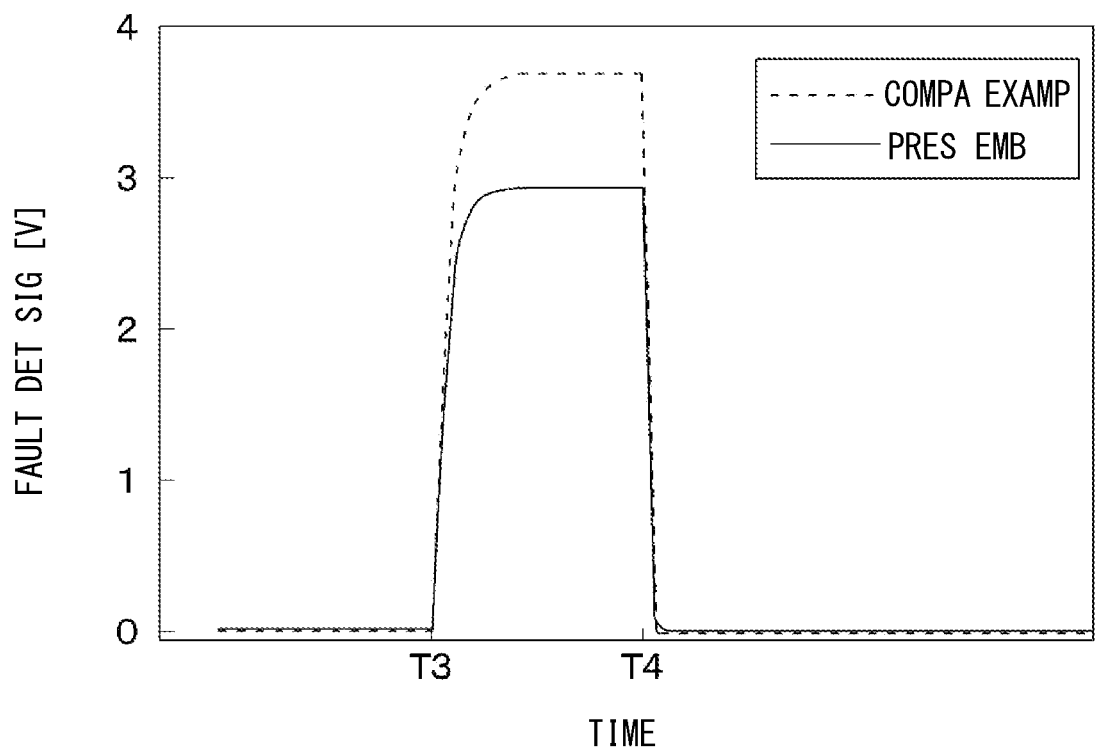
FIG. 11 illustrates the fault detected signal in the semiconductor device according to the comparative example and the fault detected signal in the semiconductor device according to the first embodiment.

As illustrated in FIG. 11, in the semiconductor device according to the comparative example (COMPA EXAMP), the level of the fault detected signal (FAULT DET SIG) is about 3.6 V in a case where a fault current sufficiently larger than a steady current flows through the main element Me. In the semiconductor device according to the present embodiment (PRES EMB), the reverse conductivity-type layer 21b is formed. However, the sense current with a predetermined amount flows to the sense element Se in a case where a large amount of the fault current flows to the main element Me, and the level of the fault detected signal is about 2.9 V. With regard to the steady detected signal and the fault detected signal in the semiconductor device according to the present embodiment, a decreasing rate of the level of the steady detected signal is sufficiently larger than a decreasing rate of the level of the fault detected signal in contrast to the steady detected signal and the fault detected signal in the semiconductor device according to the comparative example.

Figure 12:
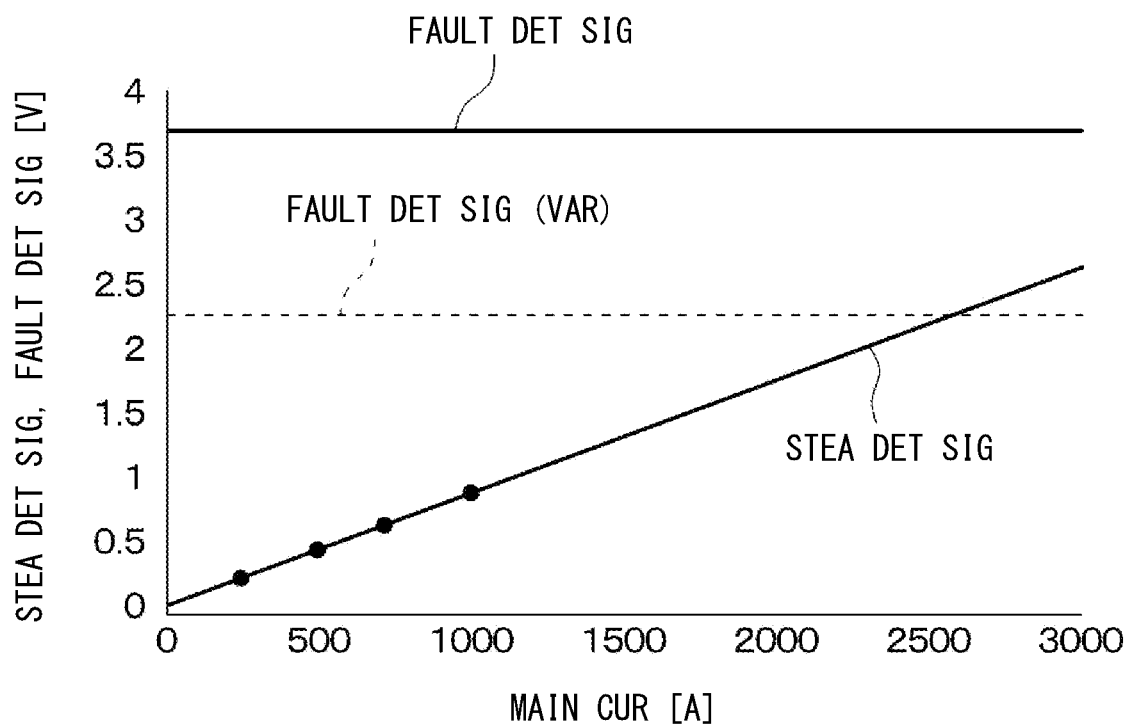
FIG. 12 illustrates the relationship between the steady detected signal and the fault detected signal in the semiconductor device according to the comparative example.

The superimposition of the fault detected signal and the steady detected signal in the semiconductor device according to the comparative example is shown in FIG. 12. The superimposition of the fault detected signal and the steady detected signal in the semiconductor device according to the present embodiment is shown in FIGS. 13, 14.

In the semiconductor device according to the comparative example, as illustrated in FIG. 12, the level of the steady detected signal increases as the level of the main current increases, and the differential voltage acquired based on the difference between the level of the steady detected signal and the level of the fault detected signal decreases. For example, even if a semiconductor device is manufactured such that the level of the fault detected signal is about 3.6 V, it is possible that the level of the steady detected signal becomes larger than the level of the fault detected signal as the level of the main current increases, in a case where the actual level of the fault detected signal is about 2.3 V due to, for example, variation in design. For example, in FIG. 12, when the level of the main current is about 2600 A, the level of the steady detected signal becomes larger than the level of the fault detected signal. In such a semiconductor device according to the comparative example, it is required to enlarge a saturation current to further enlarge the fault detected signal in advance.

Figure 13:
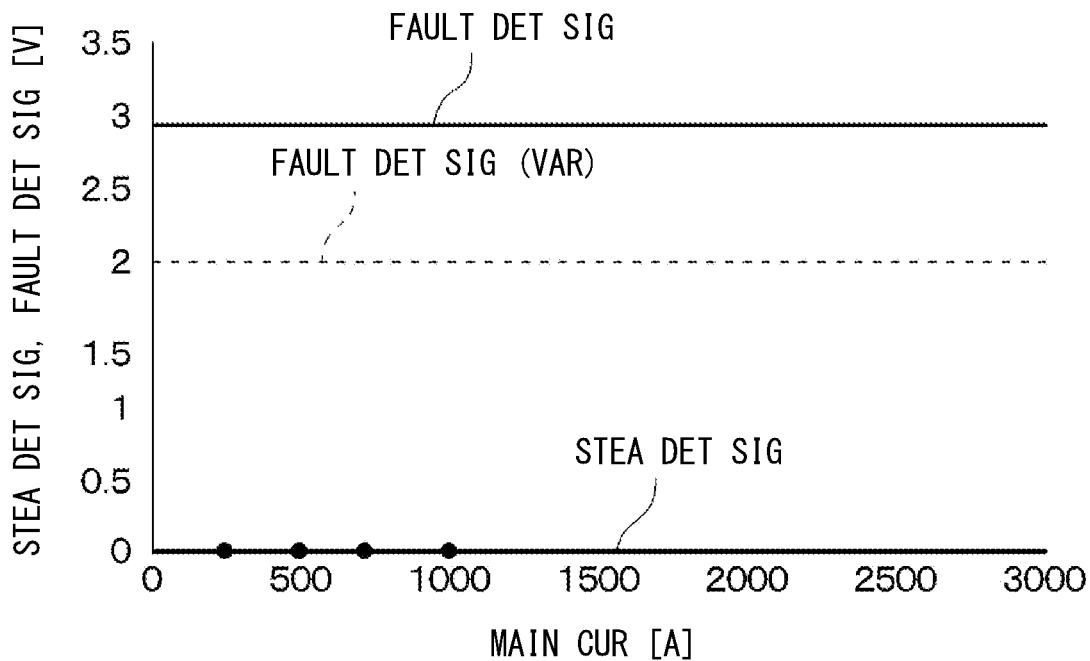
FIG. 13 illustrates the relationship between the steady detected signal and the fault detected signal in the semiconductor device according to the first embodiment.
Figure 14:
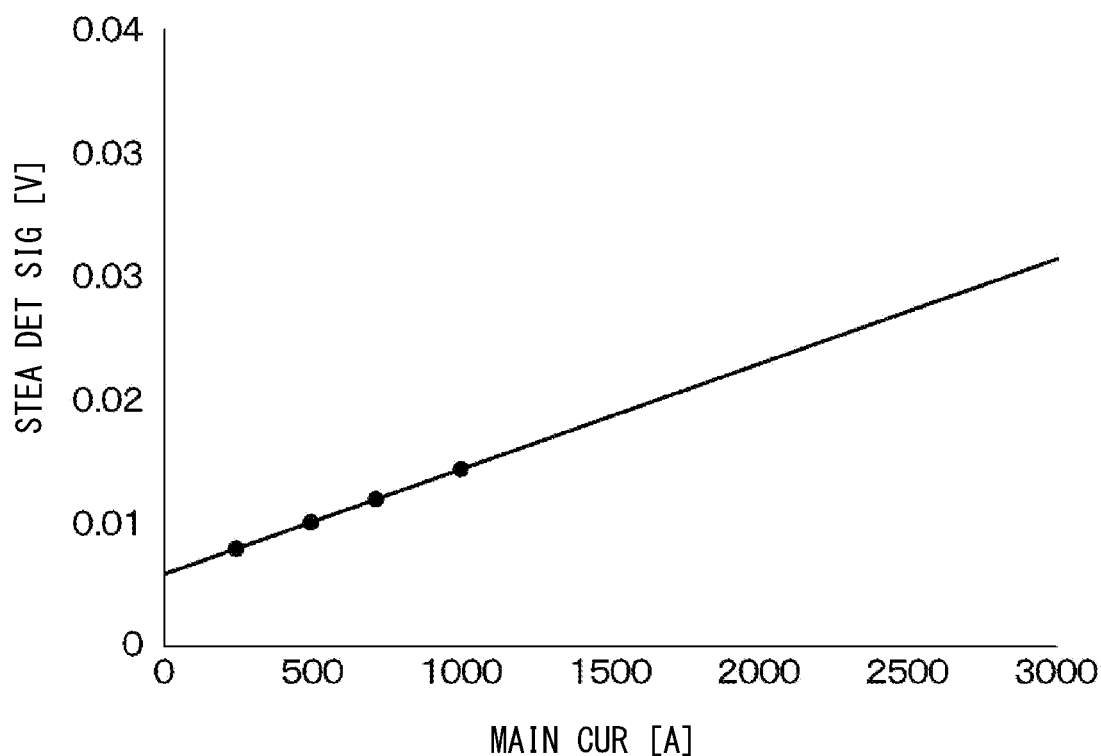
FIG. 14 illustrates the relationship between the steady detected signal and the fault detected signal in the semiconductor device according to the first embodiment.

In the semiconductor device according to the present embodiment, as illustrated in FIGS. 13, 14, the level of the steady detected signal is suppressed to a sufficiently small value, and the differential voltage acquired based on the difference between the level of the steady detected signal and the level of the fault detected signal can be sufficiently enlarged. FIG. 14 is an enlarged view of the steady detected signal in FIG. 13. According to the semiconductor device in the present embodiment, even though the level of the main current becomes larger, it is possible to inhibit a situation in which the level of steady detected signal becomes larger than the level of the fault detected signal. In the semiconductor device according to the present embodiment, since the steady detected signal is set to be smaller through the formation of the reverse conductivity-type layer 21b, the resistance of the sense element Se becomes larger. Therefore, in the semiconductor device according to the present embodiment, it becomes difficult for the sense current to flow through the sense element Se in the steady state, so that it is possible to enhance the degree of freedom in designing the saturation current.

According to the present embodiment as described above, the sense element Se includes the reverse conductivity-type layer 21b, so that it is possible to suppress the injection of the holes from the second surface 10b of the semiconductor substrate 10. For this reason, it is possible to reduce the sense current flowing through the sense element Se in the steady state, and it is possible to sufficiently reduce the level of the steady detected signal. It is possible to sufficiently enlarge the differential voltage acquired based on the difference between the level of the steady detected signal and the level of the fault detected signal to inhibit the erroneous determination.

In this semiconductor device according to the present embodiment, it is possible to suppress an increase in the switching loss caused by switching off the semiconductor device, since it is not required to increase the impurity concentration of the collector layer 21a in the main element Me to be more than a necessary level.

Modification of First Embodiment

The modification of the first embodiment will be described below. In the first embodiment, the rear surface layer 21 at the sense region Rs may not be entirely formed with the reverse conductivity-type layer 21b, the rear surface layer 21 may be formed as illustrated in FIGS. 15A to 15G. Each of FIGS. 15A to 15G is a plan view of the second surface 10b of the semiconductor substrate 10 at a portion corresponding to the region IV of FIG. 1.

Figure 15A:
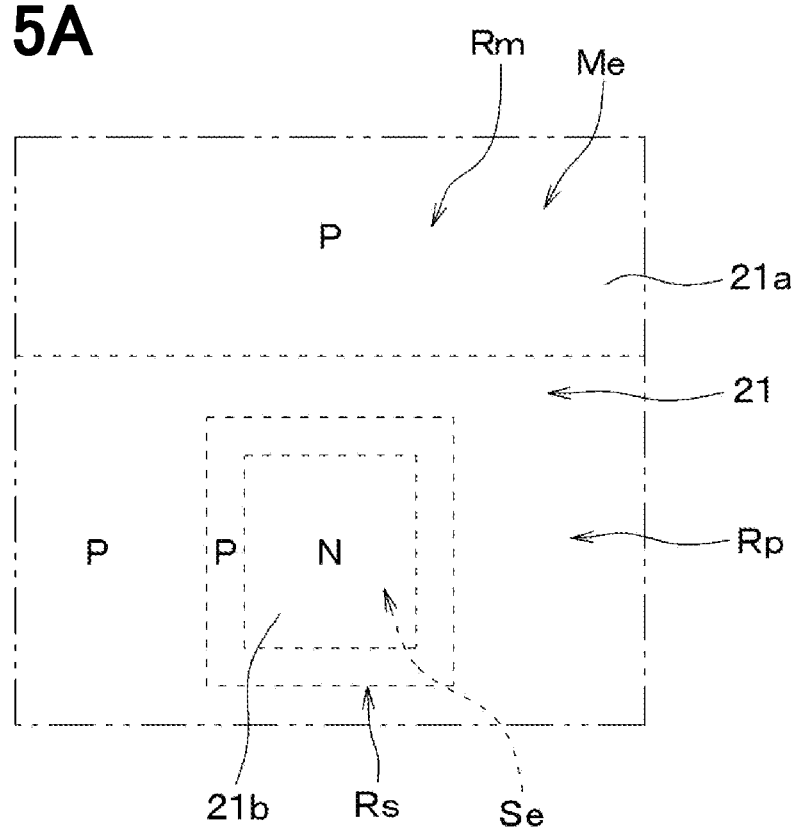
FIG. 15A is a plan view of the second surface of the semiconductor substrate in a modified example of the first embodiment.

For example, as illustrated in FIG. 15A, the rear surface layer 21 at the sense region Rs has an inner edge portion at which the reverse conductivity-type layer 21b is formed. The collector layer 21a may also be formed at the rear surface layer 21 to surround the reverse conductivity-type layer 21b. In other words, the rear surface layer 21 at the sense region Rs may include the collector layer 21a and the reverse conductivity-type layer 21b.

Figure 15B:
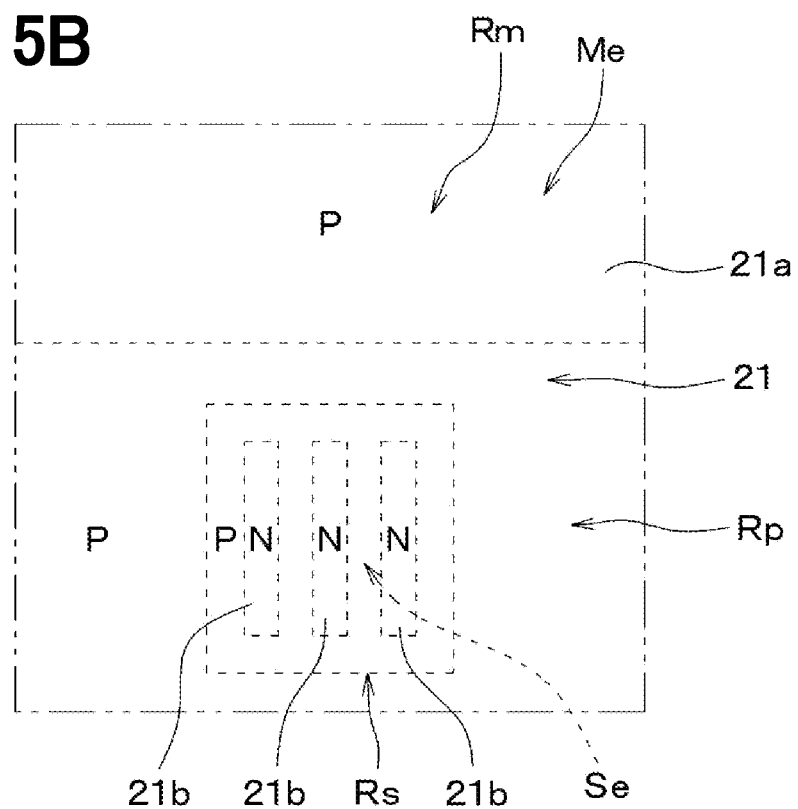
FIG. 15B is a plan view of the second surface of the semiconductor substrate in the modified example of the first embodiment.
Figure 15C:
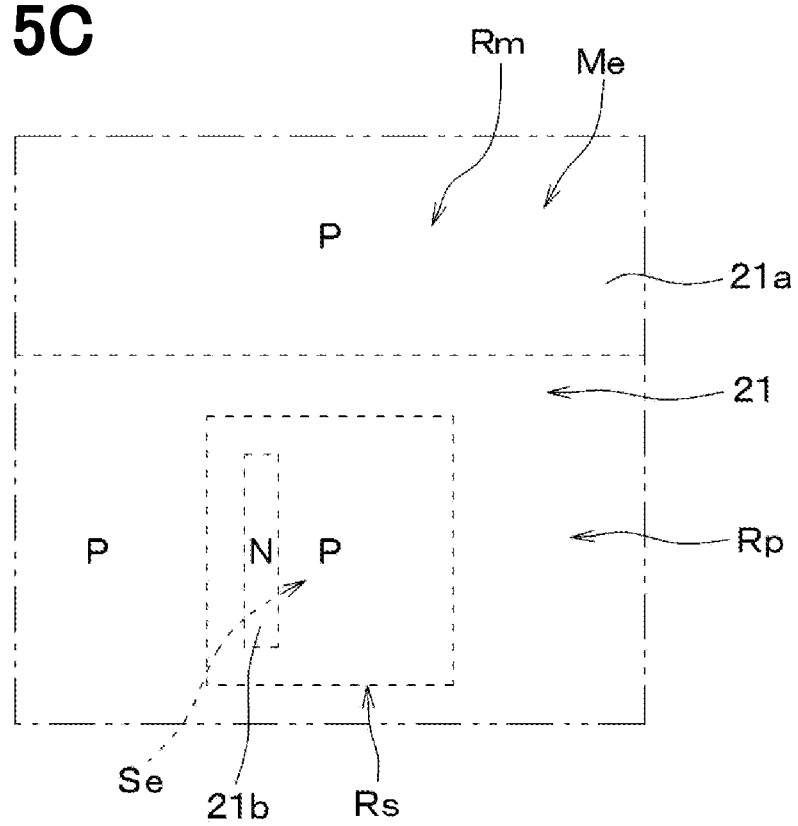
FIG. 15C is a plan view of the second surface of the semiconductor substrate in the modified example of the first embodiment.
Figure 15D:
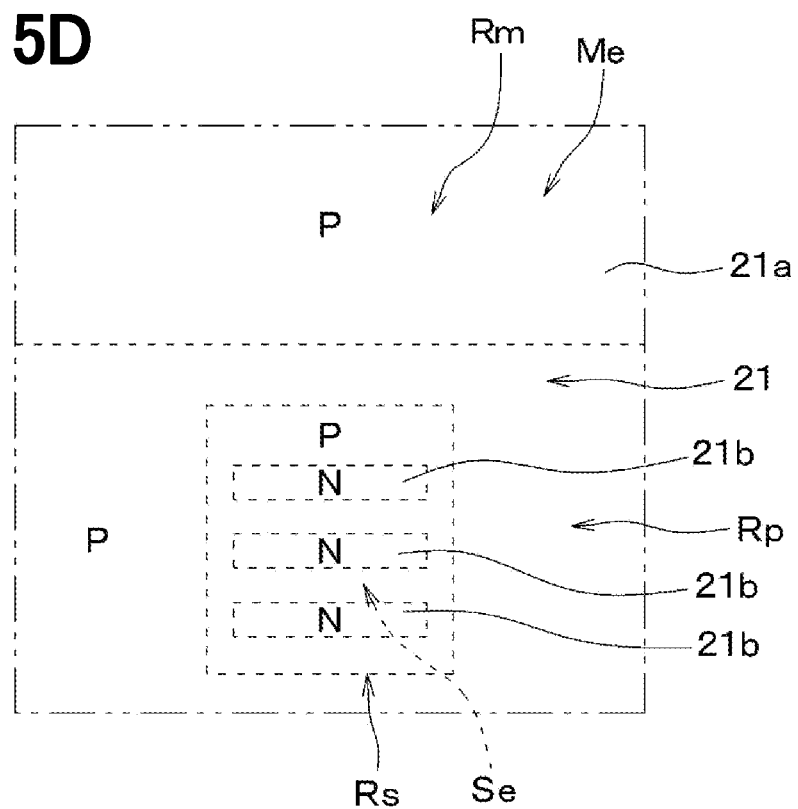
FIG. 15D is a plan view of the second surface of the semiconductor substrate in the modified example of the first embodiment.
Figure 15E:
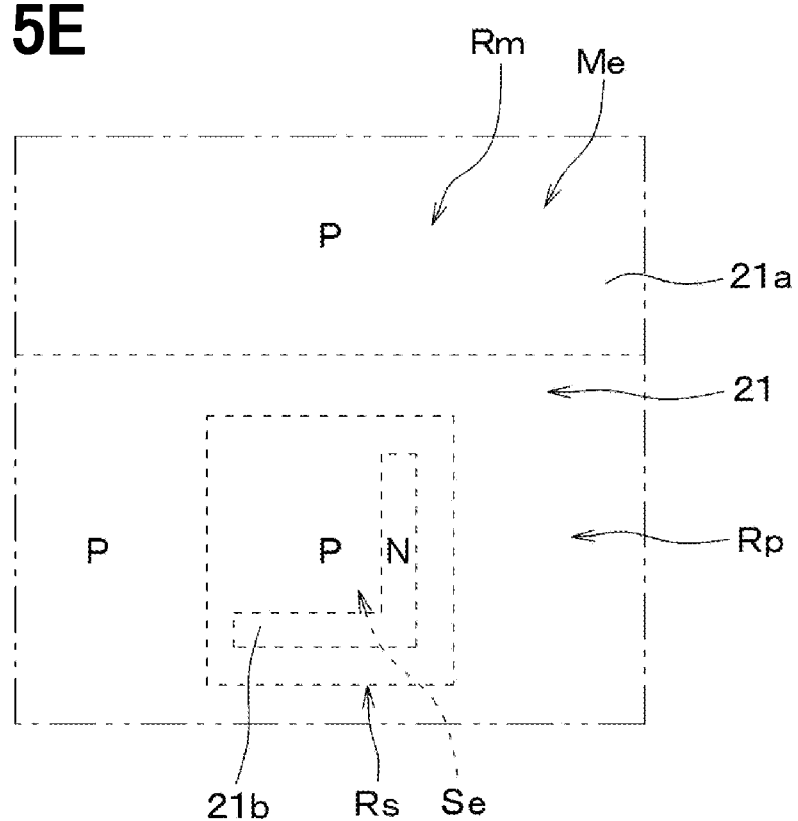
FIG. 15E is a plan view of the second surface of the semiconductor substrate in the modified example of the first embodiment.
Figure 15F:
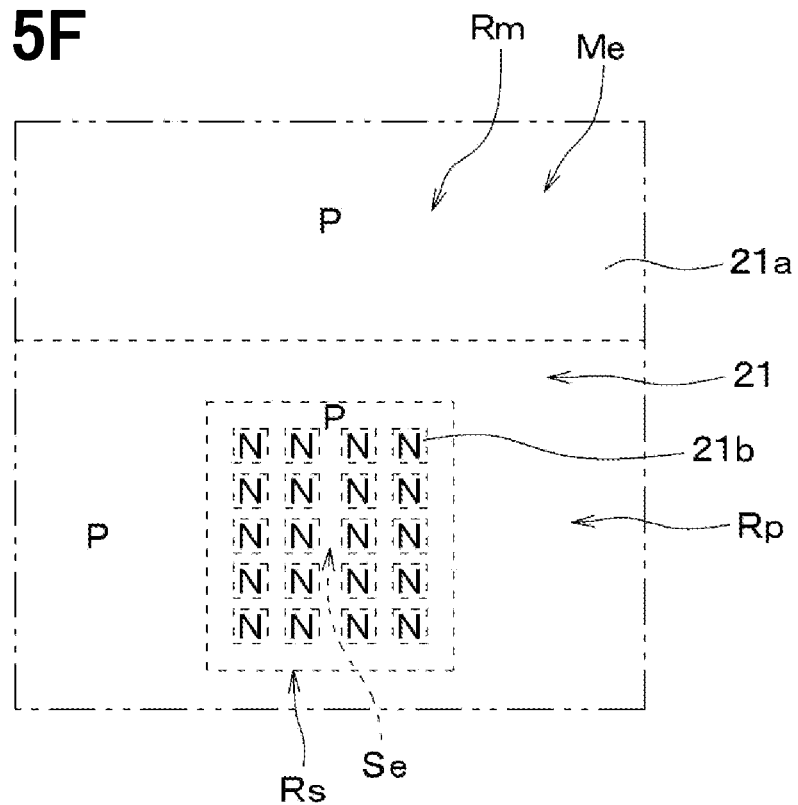
FIG. 15F is a plan view of the second surface of the semiconductor substrate in the modified example of the first embodiment.
Figure 15G:
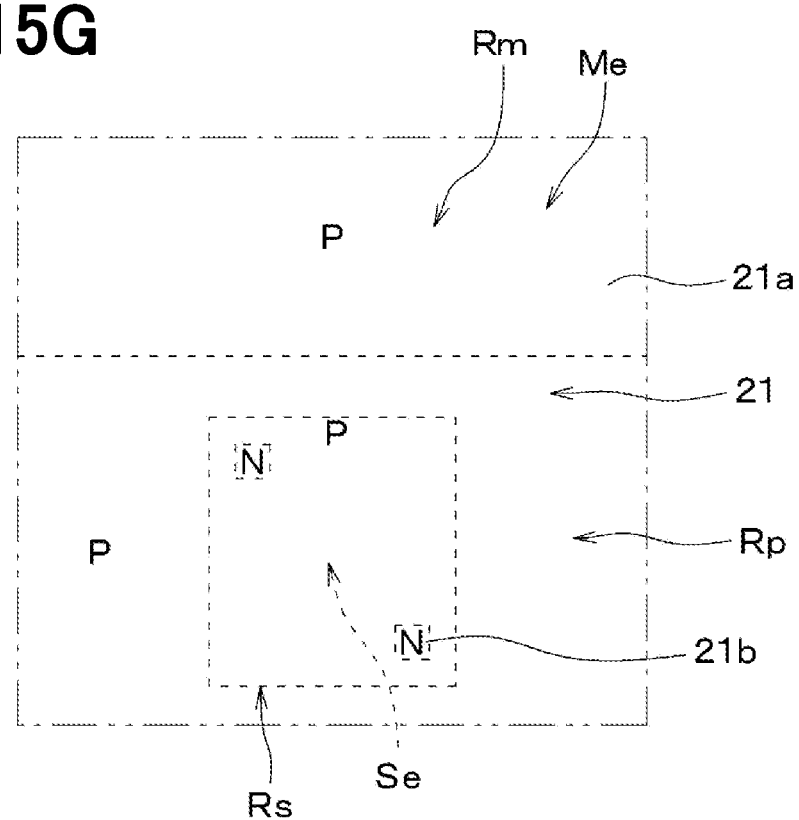
FIG. 15G is a plan view of the second surface of the semiconductor substrate in the modified example of the first embodiment.

In this case, the reverse conductivity-type layer 21b may be formed in multiple portions along a direction identical to the lengthwise direction of the reverse conductivity-type layer 21b as illustrated in FIG. 15B, or may be formed in only a single portion along a direction identical to the lengthwise direction of the reverse conductivity-type layer 21b as illustrated in FIG. 15C. As illustrated in FIGS. 15B, 15C, the reverse conductivity-type layer 21b extends along a direction from the sense region Rs toward the main region Rm. As illustrated in FIG. 15D, the reverse conductivity-type layer 21b may extend along a direction orthogonal to the direction from the sense region Rs toward the main region Rm. As illustrated in FIG. 15E, the reverse conductivity-type layer 21b may have a first portion extended along a direction from the sense region Rs toward the main region Rm and a second portion extended along a direction orthogonal to the direction from the sense region Rs toward the main region Rm. The first portion and the second portion may be connected. Further, the reverse conductivity-type layer 21b may be formed in a dotted shape as shown in FIG. 15F. In this case, the reverse conductivity-type layer 21b may be formed such that only a portion of the reverse conductivity-type layer 21b is arranged as illustrated in FIG. 15G. Although not particularly illustrated, the reverse conductivity-type layer 21b may be formed with the combination of the shapes described above, or may be formed in another shape.

Second Embodiment

The following describes a second embodiment. In contrast to the first embodiment, the present embodiment describes that multiple sense elements Se are arranged in parallel to the main element Me. In other words, the multiple sense elements Se are connected in parallel to the main element Me. The other configurations are the same as those of the first embodiment, and therefore the description of the same configurations will be omitted below.

As described above, in the semiconductor device according to the comparative example, it is possible that the difference between the level of the steady detected signal and the level of the fault detected signal may become smaller as the level of the steady detected signal becomes larger. In the semiconductor device according to the first embodiment, although it is possible to sufficiently decrease the level of the steady detected signal, the precision of detecting the main current in the steady state may decrease as the level of the steady detected signal is excessively low.

Figure 16:
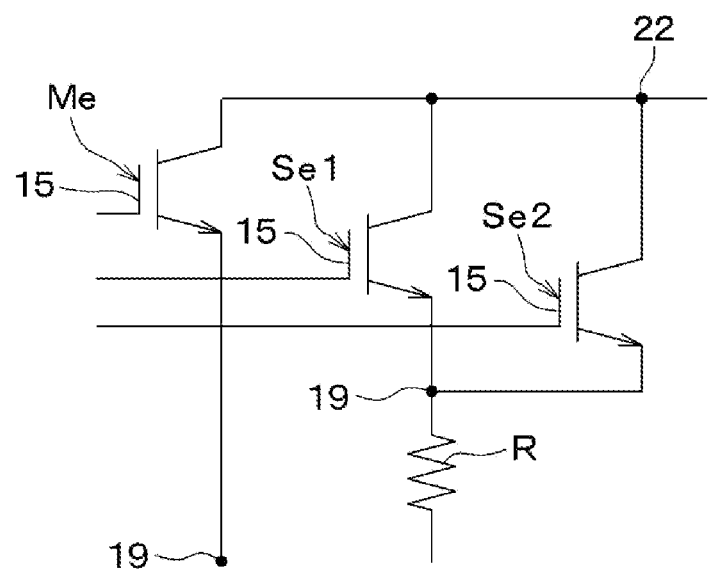
FIG. 16 is a circuit diagram that illustrates a detection resistor is connected to a semiconductor device according to the second embodiment.

For this reason, as illustrated in FIG. 16, the semiconductor device according to the present embodiment has a first sense element Se1 and a second sense element Se2 that are connected in parallel to the main element Me. The first sense element Se1 and the second sense element Se2 have different properties, in other words, characteristics. In particular, the first sense element Se1 in the present embodiment has a structure identical to the main element Me, and the collector layer 21a as the rear surface layer 21 is formed at the entire sense region Rs. On the other hand, the second sense element Se2 has a structure identical to the sense element Se described in the first embodiment, and the reverse conductivity-type layer 21b as the rear surface layer 21 is formed at the entire sense region Rs. The first sense element Se1 corresponds to a first sense element portion, and the second sense element Se2 corresponds to a second sense element portion.

Figure 17:
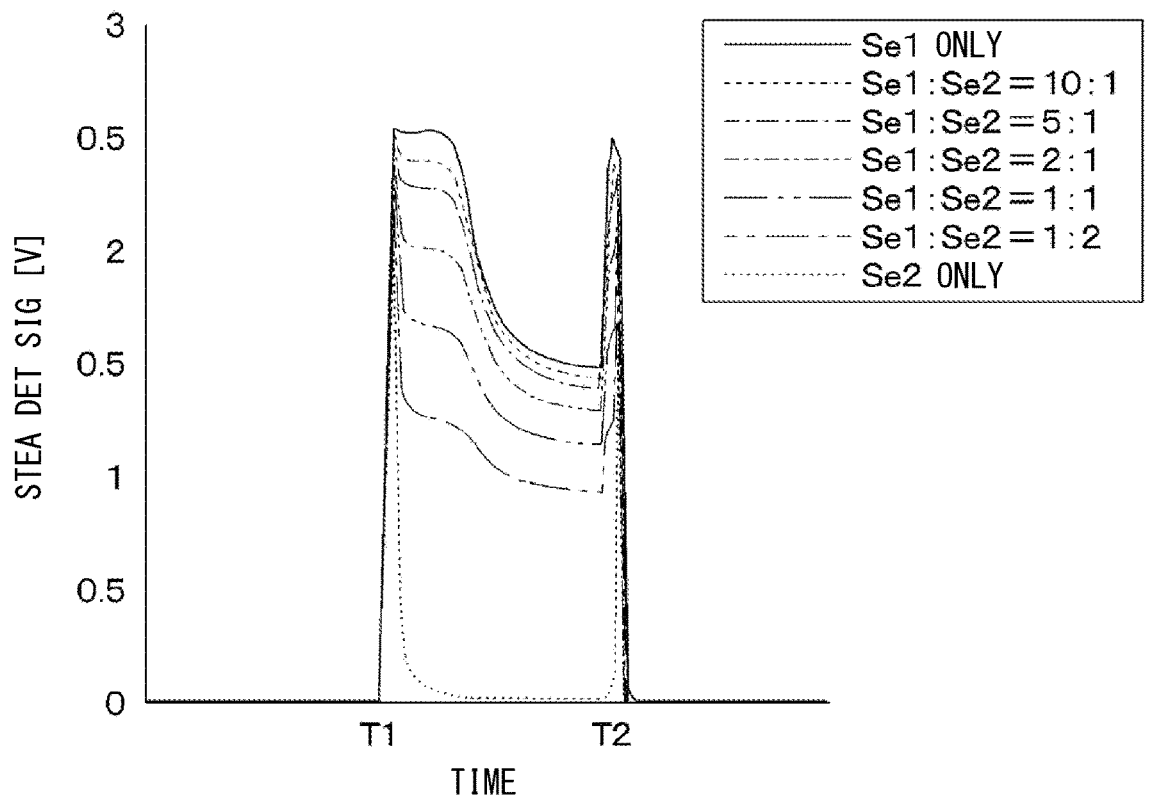
FIG. 17 illustrates the relationship between the ratio of the first sense element to the second sense element and a steady detected signal.
Figure 18:
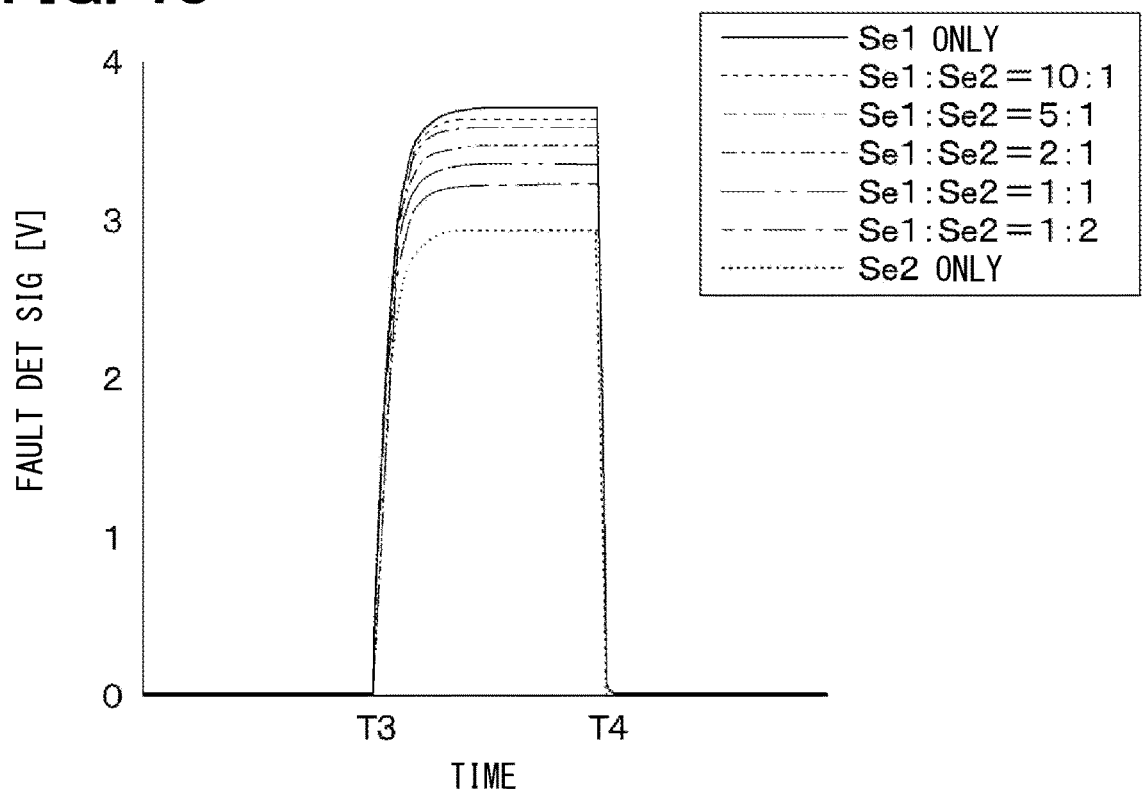
FIG. 18 illustrates the relationship between the ratio of the first sense element to the second sense element and a fault detected signal.

In such a semiconductor device, as shown in FIGS. 17 and 18, it is possible to easily adjust the level of the steady detected signal and the level of the fault detected signal by adjusting the ratio of the area of the first sense element Se1 to the area of the second sense element Se2. In particular, as illustrated in FIGS. 17, 18, the level of each of the steady detected signal and the fault detected signal increases as the proportion of the first sense element Se1 is enlarged. FIG. 17 illustrates the steady detected signal in a case where the main current is 1500 A. FIG. 18 illustrates the fault detected signal in a case where the gate-emitter voltage Vge is set to a voltage around 15 V as a typical gate drive voltage.

Figure 19:
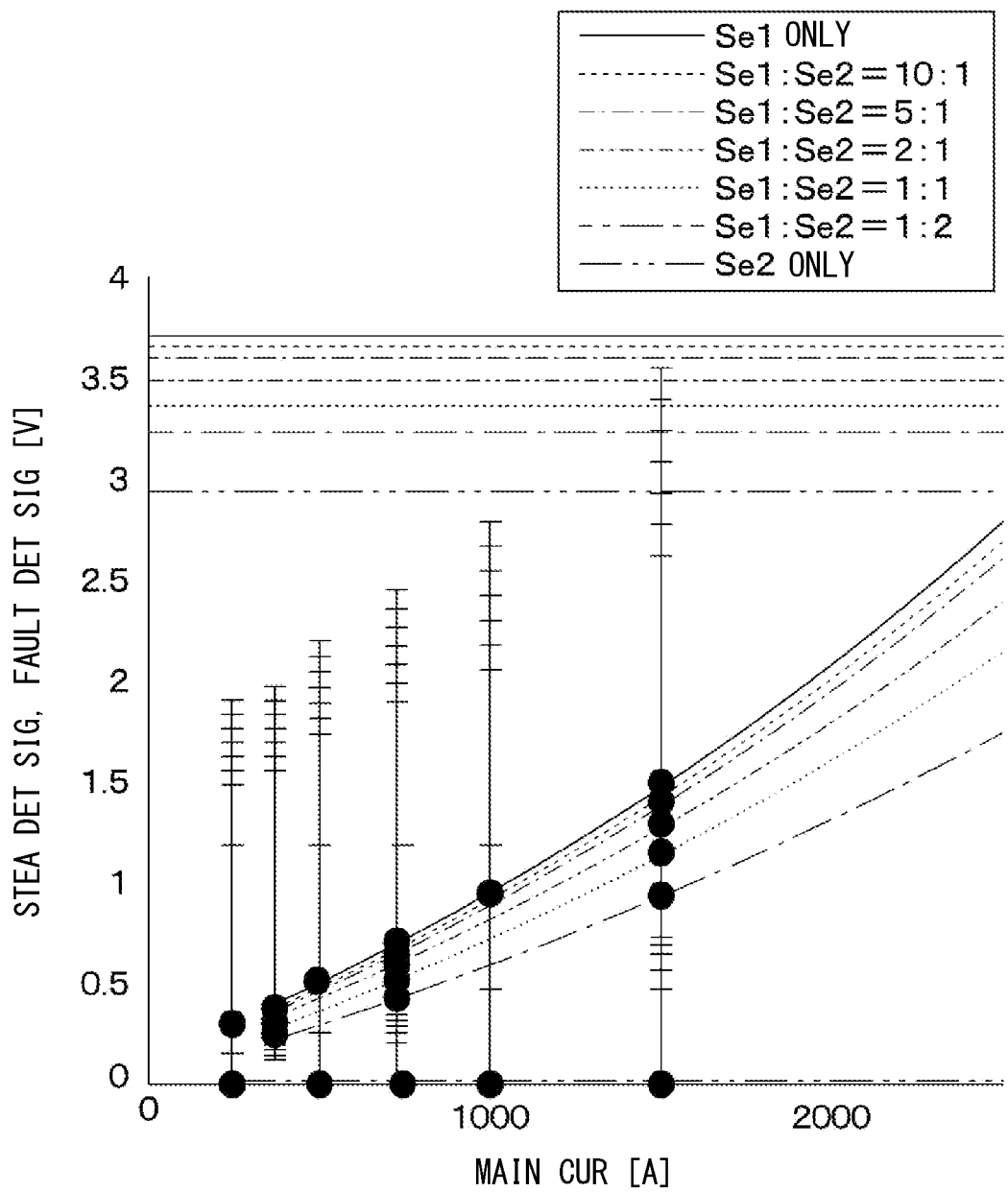
FIG. 19 illustrates the relationship between the steady detected signal and the fault detected signal.

As illustrated in FIG. 19, the differential voltage acquired based on the difference between the level of the steady detected signal and the level of the fault detected signal easily decreases as the proportion of the first sense element Se1 is enlarged. However, as described above, the level of the steady detected signal increases as the proportion of the first sense element Se1 is enlarged. Therefore, the ratio of the area of the first sense element Se1 to the area of the second sense element Se2 may be adjusted according to the requested properties. In this case, as illustrated in FIG. 19, in view of variation in design, the level of the steady detected signal may be set not to be larger than the level of the fault detected signal.

The steady detected signal in the present embodiment corresponds to the simulation result obtained by the test circuit identical to the one illustrated in FIG. 6. Similarly, the fault detected signal in the present embodiment corresponds to the simulation result obtained by the test circuit identical to the one illustrated in FIG. 10.

According to the present embodiment described above, since the sense element Se includes the reverse conductivity-type layer 21b, it is possible to sufficiently decrease the level of the steady detected signal to obtain the advantageous effect similar to the one in the first embodiment.

In the present embodiment, the first sense element Se1 and the second sense element Se2 are connected in parallel to the main element Me. The first sense element Se1 and the second sense element Se2 have different properties. Therefore, it is possible to easily modify the level of the steady detected signal and the level of the fault detected signal by adjusting the ratio of the area of the first sense element Se1 to the area of the second sense element Se2.

Third Embodiment

The following describes a third embodiment. In contrast to the first embodiment, the present embodiment describes the modification of the configuration of the sense element Se. The other configurations are the same as those of the first embodiment, and therefore the description of the same configurations will be omitted below.

Figure 20:
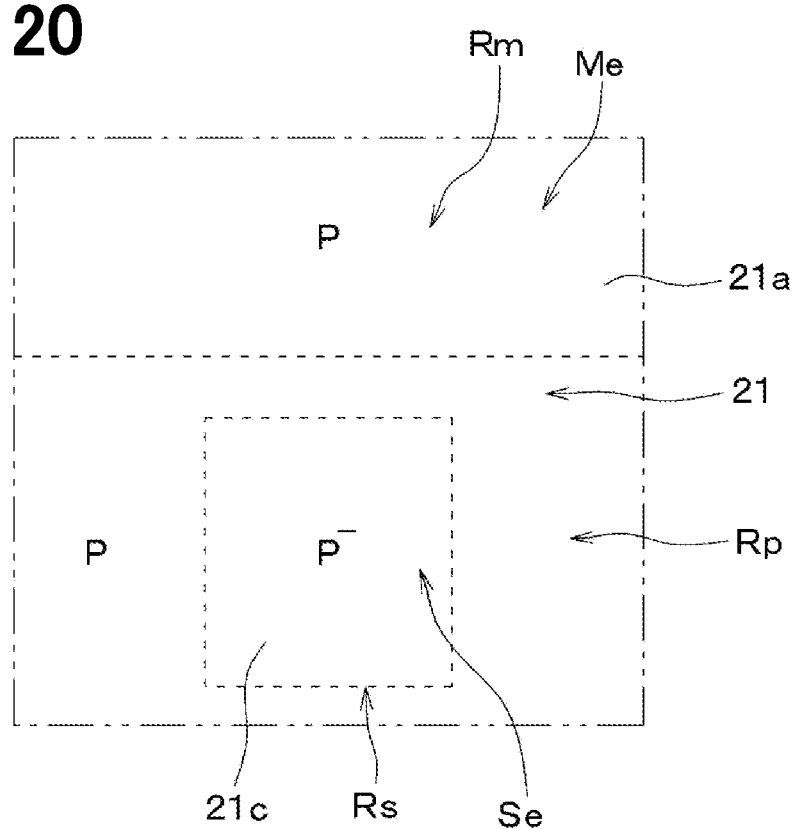
FIG. 20 is a plan view of a second surface of a semiconductor substrate according to the third embodiment.

As illustrated in FIG. 20, in the sense region Rs in the present embodiment, a P$^-$-type low-impurity-concentration layer 21c is formed as the rear surface layer 21 along the thickness direction of the semiconductor substrate 10. The low-impurity-concentration layer 21c has smaller amount of the P-type impurities than the collector layer 21a. In other words, the P$^-$-type low-impurity-concentration layer 21c has smaller dose amount than the collector layer 21a.

In particular, in the present embodiment, the collector layer 21a in the main element Me and the low-impurity-concentration layer 21c in the sense element Se are respectively formed through the ion injection from the second surface 10b of the semiconductor substrate 10. The depth of the low-impurity-concentration layer 21c in the present embodiment from the second surface 10b of the semiconductor substrate 10 is identical to the depth of the collector layer 21a from the second surface 10b of the semiconductor substrate 10. However, the peak concentration of the low-impurity-concentration layer 21c is lower than the peak concentration of the collector layer 21a. FIG. 20 is a plan view of the second surface of the semiconductor substrate 10 at a portion corresponding to the region IV of FIG. 1.

Figure 21:
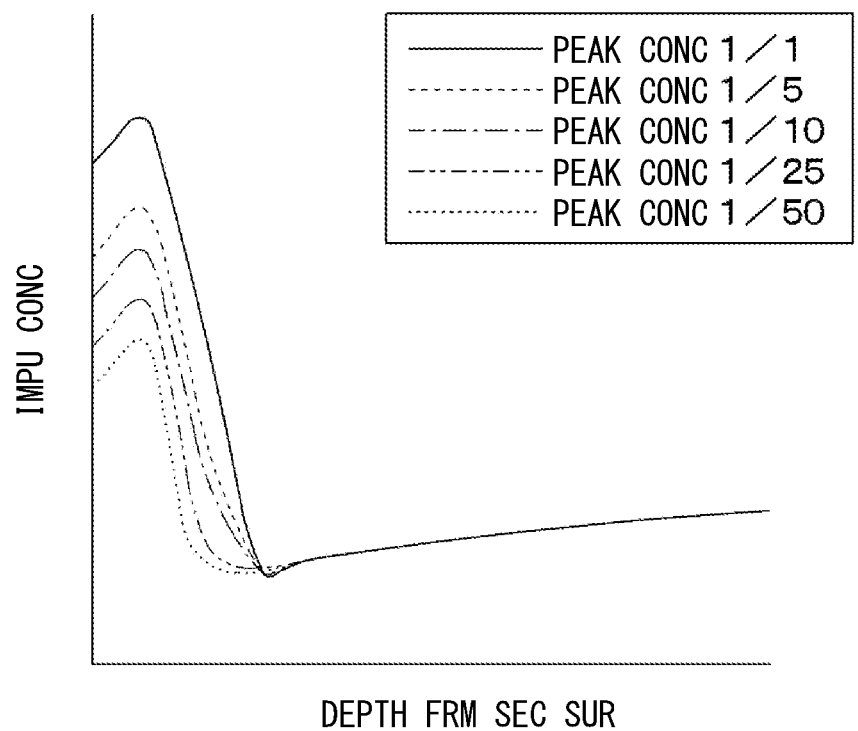
FIG. 21 illustrates the relationship between the depth from the second surface of a semiconductor substrate and a carrier concentration.

As illustrated in FIG. 21, in such a sense element Se, the impurity concentration (IMPU CONC) of the low-impurity-concentration layer 21c becomes lower as the peak concentration becomes lower along the depth from the second surface 10b (DEPTH FRM SEC SUR). In FIG. 21, the peak concentration (PEAK CONC) of the collector layer 21a is set as reference. For example, the peak concentration 1/1 illustrated in FIG. 21 is the same as the peak concentration of the collector layer 21a.

Figure 22:
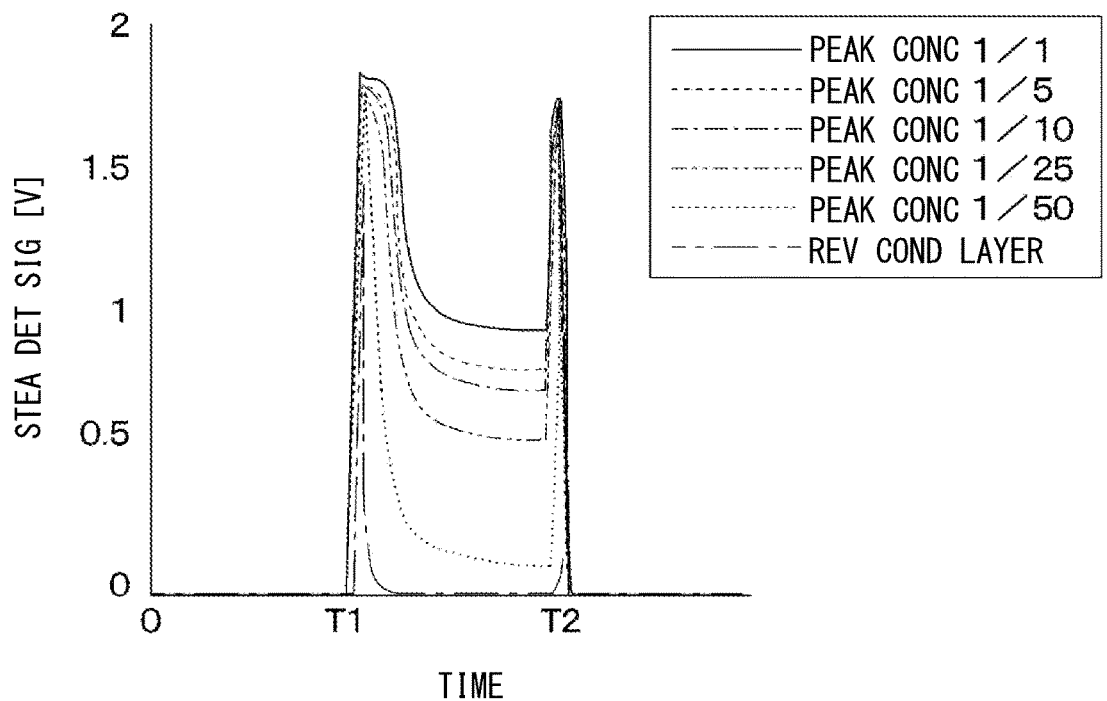
FIG. 22 illustrates the relationship between the peak concentration and the steady detected signal.
Figure 23:
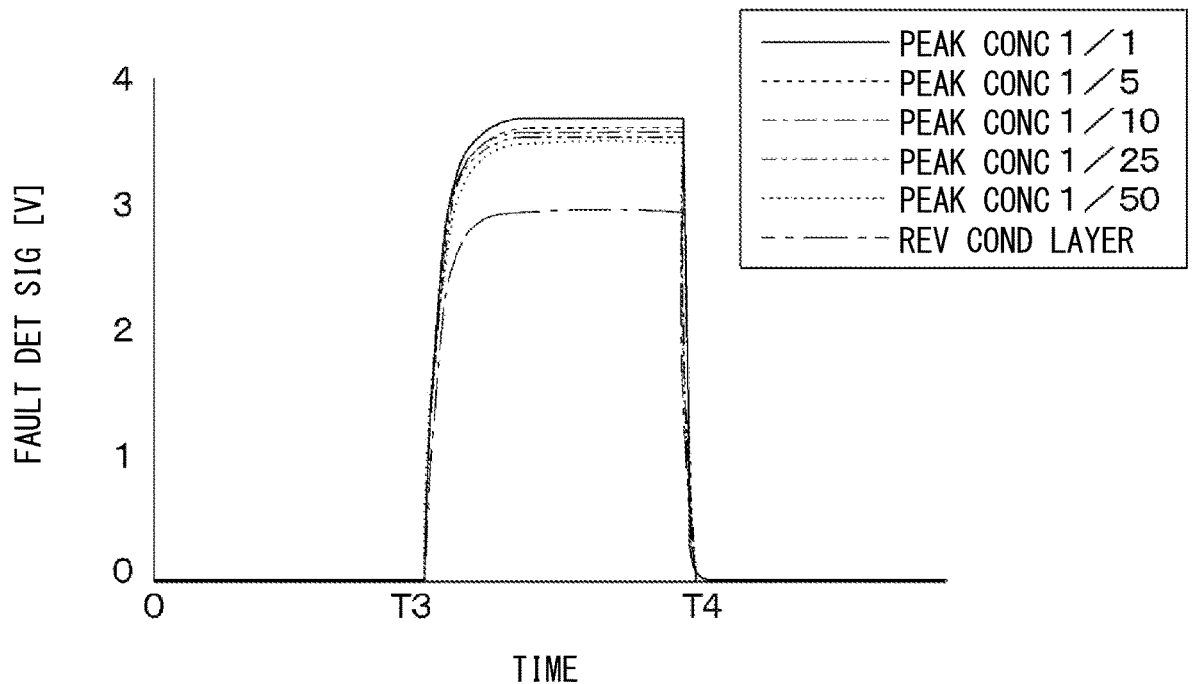
FIG. 23 illustrates the relationship between the peak concentration and the steady detected signal.

As illustrated in FIGS. 22, 23, the level of the steady detected signal and the level of the fault detected signal decrease as the peak concentration of the low-impurity-concentration layer 21c becomes lower. However, the decreasing rate of the level of steady detected signal that depends on the peak concentration of the low-impurity-concentration layer 21c is larger than the decreasing rate of the level of the fault detected signal. The low-impurity-concentration layer 21c is a P-type layer even though, for example, the peak concentration of the low-impurity-concentration layer 21c is one fiftieth (1/50) of the peak concentration of the collector layer 21a. For this reason, the level of the steady detected signal and the level of the fault detected signal become larger as compared with the case where the rear surface layer 21 is the reverse conductivity-type layer 21b as described in the first embodiment. FIG. 22 illustrates the steady detected signal in a case where the main current is 1000 A. FIG. 23 illustrates the fault detected signal in a case where the voltage between the gate and emitter Vge is set to a voltage around 15 V as a typical gate drive voltage.

Figure 24:
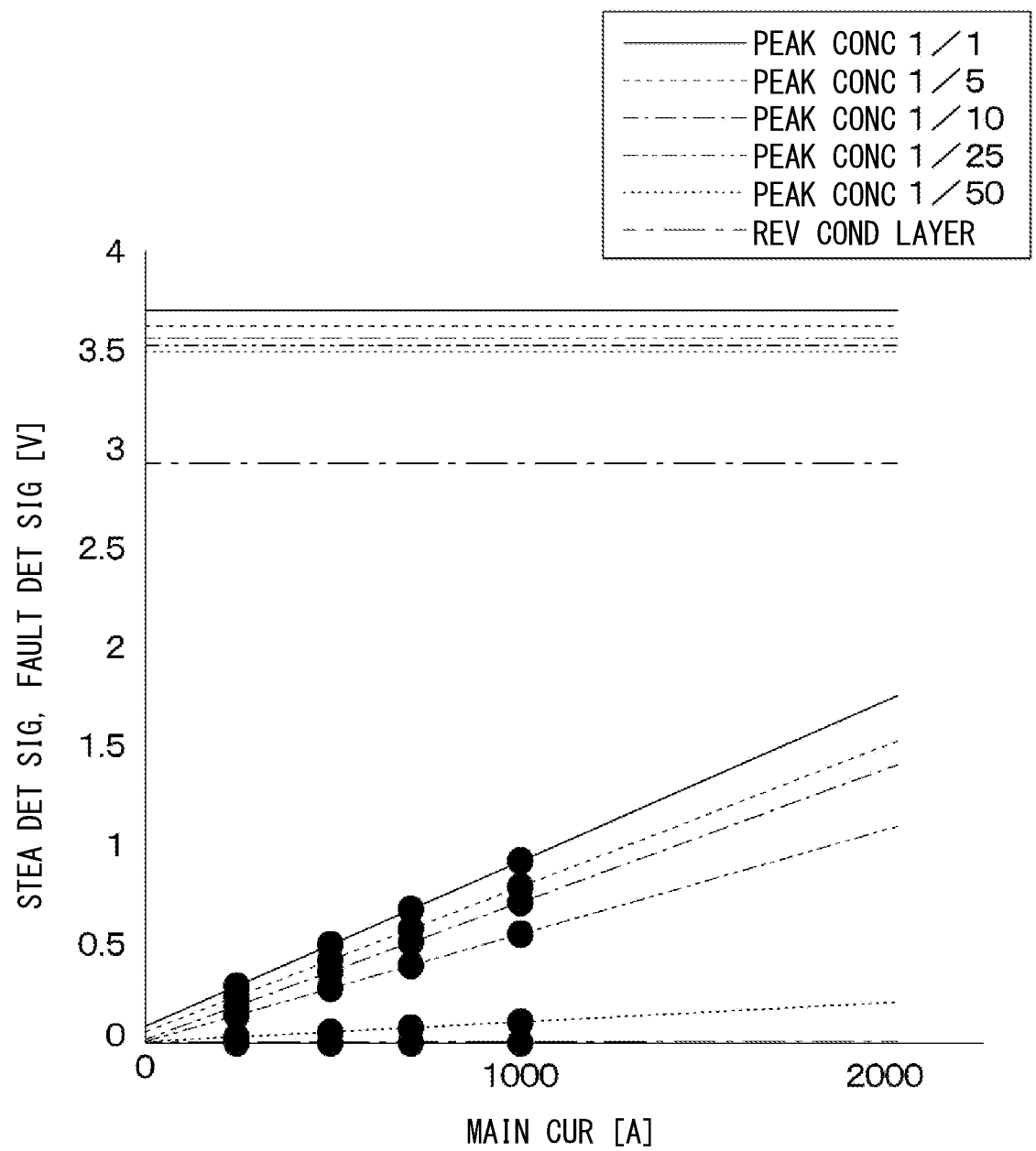
FIG. 24 illustrates the relationship between the steady detected signal and the fault detected signal.
Figure 25:
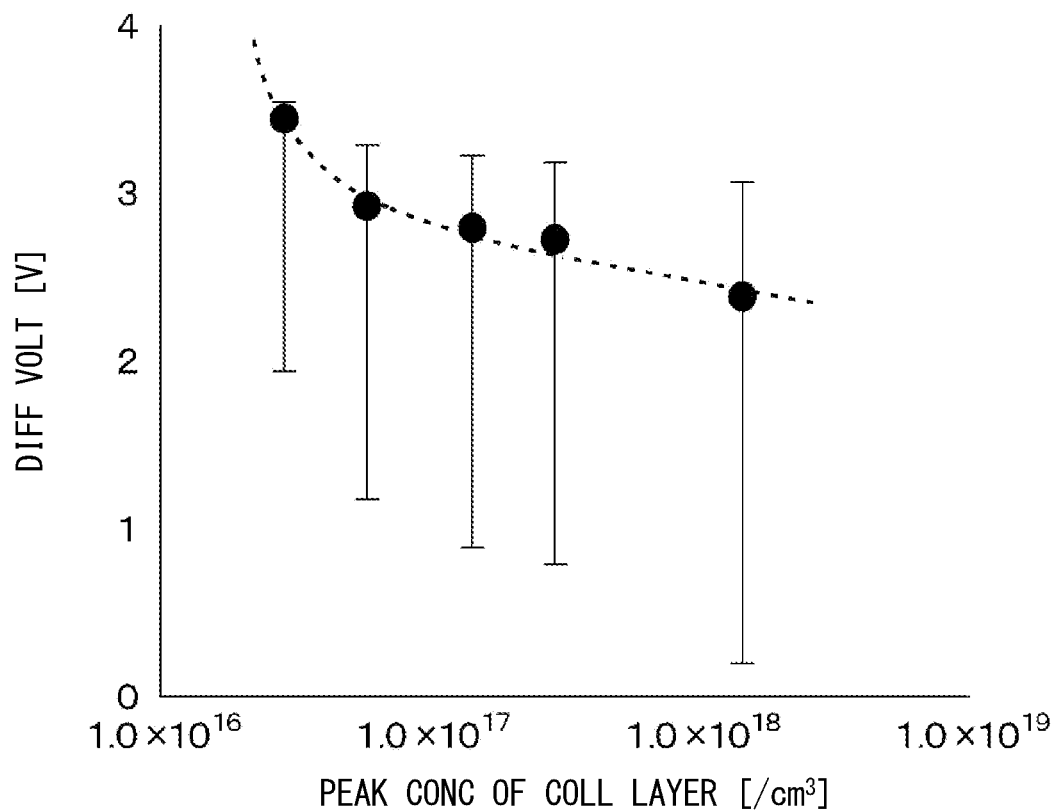
FIG. 25 illustrates the peak concentration of a collector layer and a differential voltage.

As illustrated in FIG. 24, the differential voltage acquired based on the difference between the level of the steady detected signal and the fault detected signal easily decreases as the peak concentration of the collector layer (PEAK CONC OF COLL LAYER) 21a increases. In other words, the differential voltage (DIFF VOLT) acquired based on the difference between the level of the steady detected signal and the level of the fault detected signal easily decreases as the peak voltage of the low-impurity-concentration layer 21c increases. Therefore, the low-impurity-concentration layer 21c may be adjusted according to the demanded properties. In this case, as illustrated in FIG. 25, in view of variation in design, it may be preferable that the level of the steady detected signal is set not to be larger than the fault detected signal. In other words, in FIG. 25, in view of the variation in design, the differential voltage may be set to 0 V or higher.

The steady detected signal in the present embodiment corresponds to the simulation result obtained by the test circuit identical to the one illustrated in FIG. 6. Similarly, the fault detected signal in the present embodiment corresponds to the simulation result obtained by the test circuit identical to the one illustrated in FIG. 10.

According to the present embodiment as described above, the sense element Se includes the P$^-$-type low-impurity-concentration layer 21c. Therefore, the same effects as those of the first embodiment can be obtained.

In the present embodiment, the sense element Se includes the P$^-$-type low-impurity-concentration layer 21c. Therefore, it is possible to inhibit a situation in which the steady detected signal of the sense element Se excessively decreases, as compared with the case where the rear surface layer 21 of the sense element Se is formed by only the reverse conductivity-type layer 21b.

Modification of Third Embodiment

Figure 26:
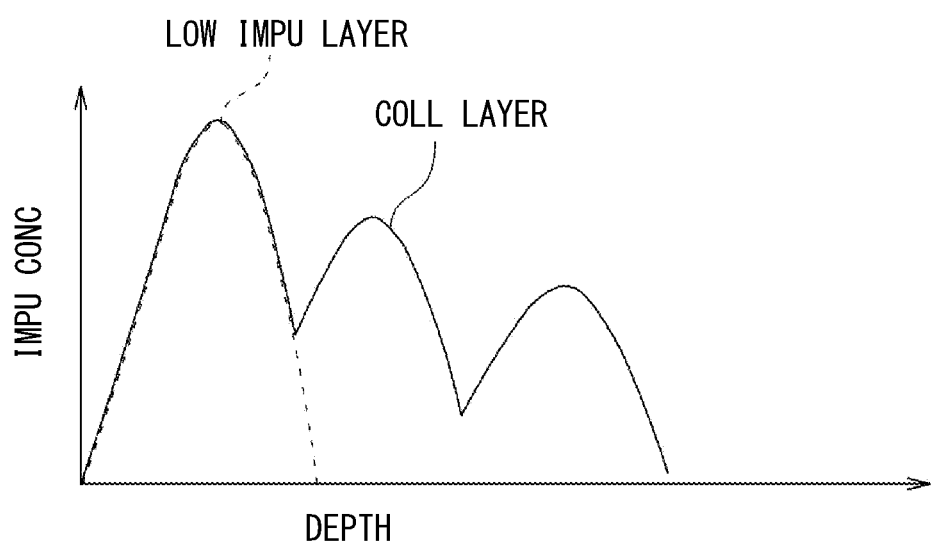
FIG. 26 illustrates an impurity concentration in a modified example of the third embodiment.

The third embodiment describes that the low-impurity-concentration layer 21c as a low-impurity layer having smaller peak concentration than the peak concentration of the collector layer 21a. However, the low-impurity layer may be formed as described in the following. For example, as illustrated in FIG. 26, the low-impurity layer (LOW IMPU LAYER) has the peak concentration of the impurity concentration (IMPU CONC) identical to the collector layer (COLL LAYER) 21a. However, the depth of the low-impurity layer from the second surface 10b of the semiconductor substrate 10 may be shallower than the collector layer 21a to reduce the amount of impurities of the low-impurity layer along the thickness direction of the semiconductor substrate 10. In other words, the low-impurity layer has the peak concentration identical to the collector layer 21a; however, the low-impurity layer may have a shorter thickness than the collector layer 21a.

For example, the collector layer 21a and the low impurity layer are formed as described in the following. In other words, the collector layer 21a is formed by executing ion-injection multiple times while changing an acceleration voltage and the low-impurity-concentration layer 21c is formed by executing ion-injection one time, so that the collector layer 21a and the low-impurity layer are formed.

In the third embodiment, the shape of the low-impurity-concentration may be appropriately modified as in the modified example of the first embodiment. The sense element Se may have the reverse conductivity-type layer 21b and the low-impurity-concentration layer 21c that are formed as the rear surface layer 21 through the combination of the third embodiment and the first embodiment.

Fourth Embodiment

The following describes a fourth embodiment. In contrast to the first embodiment, the configuration of the main region Rm is modified in the present embodiment. The other configurations are the same as those of the first embodiment, and therefore the description of the same configurations will be omitted below.

Figure 27:
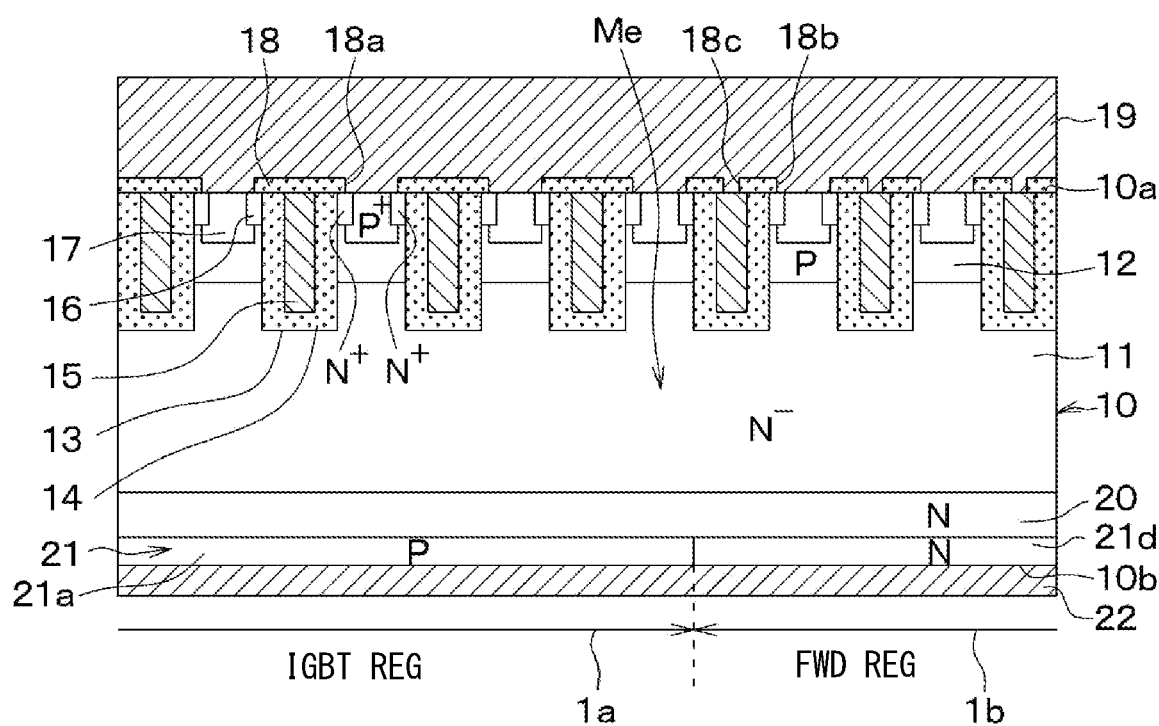
FIG. 27 is a cross-sectional view of a main region according to a fourth embodiment.

In the semiconductor device according to the present embodiment, as illustrated in FIG. 27, the main region Rm includes an Insulated Gate Bipolar Transistor region (IGBT REG) 1a and a Freewheeling Diode region (FWD REG) 1b. The IGBT element is formed at the IGBT region 1a. The FWD region 1b is adjacent to the IGBT region 1a, and functions as an FWD element. In other words, the semiconductor device according to the present embodiment has a reverse conducting (RC) IGBT in which the IGBT region 1 and the FWD region 1b are formed at the common semiconductor substrate 10. In the present embodiment, a portion above the collector layer 21a located at the second surface 10b of the semiconductor substrate 10 is set as the IGBT region 1a, and a portion above a cathode layer 21d located at the second surface 10b of the semiconductor substrate 10 is set as the FWD region 1b.

The IGBT region 1a has the same configuration as the main region Rm in the first embodiment. In the present embodiment, the FWD region 1b has the configuration at a side closer to the first surface 10a of the semiconductor substrate 10 that is identical to the configuration of the IGBT region. A contact hole 18b for exposing, for example, the contact region 17 and a contact hole 18c for exposing the gate electrode 15 are formed at the interlayer insulation film 18 in the FWD region 1b.

The upper electrode 19 is electrically connected to the contact region 17 through the contact hole 18b in the FWD region 1b. That is, the upper electrode 19 in the present embodiment functions as an emitter electrode in the IGBT region 1a, and functions as an anode electrode in the diode region 1b. The upper electrode 19 in the present embodiment is also electrically connected to the gate electrode 15 in the FWD region 1b. The gate electrode 15 in the FWD region 1b has a potential identical to the potential of the upper electrode 19.

The N-type cathode layer 21d is formed as the rear surface layer 21 at a side closer to the second surface 10b of the semiconductor substrate 10 to be adjacent to the collector layer 21a. In the semiconductor device according to the present embodiment, the portion above the collector layer 21a located at the second surface 10b of the semiconductor substrate 10 is set as the IGBT region 1a, and the portion above the cathode layer 21d located at the second surface 10b of the semiconductor substrate 10 is set as the FWD region 1b. The cathode layer 21d in the present embodiment has the same impurity concentration as the reverse conductivity-type layer 21b in the sense region Rs, and the both of the cathode layer 21d and the reverse conductivity-type layer 21b have the same depths.

According to the present embodiment described above, since the sense element Se includes the reverse conductivity-type layer 21b, it is possible to sufficiently decrease the level of the steady detected signal to obtain the advantageous effect similar to the one in the first embodiment.

In the present embodiment, the semiconductor includes the FWD region 1b at the main region Rm. The cathode layer 21d at the FWD region 1b has the same impurity concentration as the reverse conductivity-type layer 21b in the sense region Rs, and the both of the cathode layer 21d and the reverse conductivity-type layer 21b have the same depths. Therefore, in the present embodiment, it is possible to form the cathode layer 21d and the reverse conductivity-type layer 21b at the same time. Therefore, it is possible to arrange the reverse conductivity-type layer 21b without lengthening the manufacturing process.

Modification of Fourth Embodiment

The following describes the modification of the fourth embodiment. In the fourth embodiment, the configuration of the FWD region 1b may be appropriately modified. For example, the gate electrode 15 and the emitter region 16 may not have to be formed at the FWD region 1b. When the main region Rm includes the IGBT region 1a and the FWD region 1b, the main region Rm may be a region through which the current mainly flows.

Other Embodiments

Although the present disclosure has been described in accordance with the embodiments, it is understood that the present disclosure is not limited to such embodiments or structures. The present disclosure encompasses various modifications and variations within the scope of equivalents. Furthermore, various combinations and modes, and other combination and modes including only one, more or less element, fall within the spirit and scope of the present disclosure.

For example, in each of the above-described embodiments, the first conductive type is N-type and the second conductive type is P-type. Alternatively, the first conductive type may be P-type and the second conductive type may be N-type.

In each of the above embodiments, the semiconductor device includes the main element Me and the sense element Se that respectively have trench gate structures. However, the semiconductor device may include main element Me and the sense element Se that respectively have planar gate structures.

In each of the above embodiments, the arrangement of the emitter region 16 and the contact region 17 may be appropriately modified. For example, the emitter region 16 and the contact region 17 may be arranged alternately along the lengthwise direction of the trench 13.

In addition, each of the above embodiments can be combined as appropriate to form the semiconductor device. For example, the sense element Se may include the first sense element Se1 and the second sense element Se2 that respective have different properties, by combining the second embodiment with the third embodiment or the fourth embodiment. The rear surface layer 21 of the sense element Se may be formed with the low-impurity concentration layer 21c by combining the third embodiment with the fourth embodiment. The combinations of each embodiment may be further combined.

What is claimed is:

1. A semiconductor device comprising:
   a main element disposed at a main region, the main element configured to allow a main current to flow through the main element; and
   a sense element disposed at a sense region, the sense element configured to allow a sense current to flow through the sense element,
   wherein the main current flowing through the main element is detected based on the sense current flowing through the sense element,
   wherein each of the main element and the sense element includes:
      a drift layer of a first conductivity type;
      a base layer of a second conductivity type disposed on the drift layer;
      an emitter region of the first conductivity type disposed at a surface layer portion of the base layer, the emitter region having higher impurity concentration than the drift layer;
      a gate insulation film disposed at a surface of the base layer interposed between the emitter region and the drift layer;
      a gate electrode disposed on the gate insulation film;
      a rear surface layer disposed at a side facing the base layer with the drift layer interposed between the rear surface layer and the base layer;
      a first electrode electrically connected to the emitter region and the base layer; and
      a second electrode electrically connected to the rear surface layer,
   wherein the rear surface layer in the main element includes a collector layer of the second conductivity type, and
   wherein the rear surface layer in the sense element includes a low-impurity layer of the second conductivity type having lower amount of impurities than the collector layer of the rear surface in the main element along a stacking direction of the drift layer and the base layer.

2. The semiconductor device according to claim 1,
   wherein the sense element includes a first sense element portion and a second sense element portion,
   wherein the first sense element portion is different from the second sense element portion in a structure of the low-impurity layer, and
   wherein the first sense element portion and the second sense element portion are connected in parallel to the main element.

3. The semiconductor device according to claim 1,
   wherein the main region includes:
      an insulated gate bipolar transistor region having an insulated gate bipolar transistor element with the collector layer; and
      a freewheeling diode region having a freewheeling diode element with a cathode layer of the first conductivity type included in the rear surface layer,
   wherein the low-impurity layer includes a reverse conductivity-type layer of the first conductivity type, and
   wherein the reverse conductivity-type layer has a thickness identical to the cathode layer, and has impurity concentration identical to the cathode layer.

4. The semiconductor device according to claim 1,
   wherein the low-impurity layer includes a low-impurity-concentration layer of the second conductivity type having lower peak impurity concentration than the collector layer.

5. A semiconductor device comprising:
   a main element disposed at a main region, the main element configured to allow a main current to flow through the main element; and
   a sense element disposed at a sense region, the sense element configured to allow a sense current to flow through the sense element,
   wherein the main current flowing through the main element is detected based on the sense current flowing through the sense element,
   wherein each of the main element and the sense element includes:
      a drift layer of a first conductivity type;
      a base layer of a second conductivity type disposed on the drift layer;
      an emitter region of the first conductivity type disposed at a surface layer portion of the base layer, the emitter region having higher impurity concentration than the drift layer;
      a gate insulation film disposed at a surface of the base layer interposed between the emitter region and the drift layer;
      a gate electrode disposed on the gate insulation film;
      a rear surface layer disposed at a side facing the base layer with the drift layer interposed between the rear surface layer and the base layer;
      a first electrode electrically connected to the emitter region and the base layer; and
      a second electrode electrically connected to the rear surface layer, and
   wherein the rear surface layer in the sense element has lower amount of impurities of a second conductivity type than the rear surface layer in the main element along a stacking direction of the drift layer and the base layer.

* * * * *